US011152372B2

(12) United States Patent
Ishigami et al.

(10) Patent No.: US 11,152,372 B2
(45) Date of Patent: Oct. 19, 2021

(54) METHOD USED IN FORMING INTEGRATED CIRCUITRY, AND METHOD USED IN FORMING MEMORY CIRCUITRY

(71) Applicant: Micron Technology, Inc., Boise, ID (US)

(72) Inventors: Hitoshi Ishigami, Hiroshima (JP); Kentaro Hyodo, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/800,219

(22) Filed: Feb. 25, 2020

(65) Prior Publication Data
US 2021/0265359 A1 Aug. 26, 2021

(51) Int. Cl.
*H01L 21/4763* (2006.01)
*H01L 27/108* (2006.01)
(Continued)

(52) U.S. Cl.
CPC .. *H01L 27/10855* (2013.01); *H01L 21/02126* (2013.01); *H01L 21/76801* (2013.01);
(Continued)

(58) Field of Classification Search
CPC ......... H01L 27/10855; H01L 27/10882; H01L 27/10814; H01L 27/10885; H01L 23/5226;
(Continued)

(56) References Cited

U.S. PATENT DOCUMENTS 6,077,778 A * 6/2000 Hsiao ................ H01L 21/32051
257/E21.295
9,754,946 B1 * 9/2017 Yang .................. H01L 21/7682
(Continued)

OTHER PUBLICATIONS

Kane et al.,"Use of SiBN and SiBON Films Prepared by Plasma Enhanced Chemical Vapor Deposition from Borazine as Interconnection Dielectrics", The Electrochemical Society vol. 144, No. 2, Feb. 1997, United States, pp. 658-663.
(Continued)

*Primary Examiner* — Shouxiang Hu
(74) *Attorney, Agent, or Firm* — Wells St. John P.S.

(57) ABSTRACT

A method used in forming integrated circuitry comprises forming conductive line structures having conductive vias laterally between and spaced longitudinally along immediately-adjacent of the conductive line structures. First insulating material is formed laterally between immediately-adjacent of the conductive vias, Second insulating material is formed directly above the first insulating material and directly above the conductive vias. The second insulating material comprises silicon, carbon, nitrogen, and hydrogen. A third material is formed directly above the second insulating material. The third material and the second insulating material comprise different compositions relative one another. The third material is removed from being directly above the second insulating material and the thickness of the second insulating material is reduced thereafter. A fourth insulating material is formed directly above the second insulating material of reduced thickness. A plurality of electronic components is formed above the fourth insulating material and that individually are directly electrically coupled to individual of the conductive vias through the fourth and second insulating materials. Other embodiments, including structure, are disclosed.

22 Claims, 34 Drawing Sheets

(51) Int. Cl.
*H01L 21/768* (2006.01)
*H01L 21/02* (2006.01)

(52) U.S. Cl.
CPC .. *H01L 21/76834* (2013.01); *H01L 21/76837* (2013.01); *H01L 21/76885* (2013.01); *H01L 21/76886* (2013.01); *H01L 27/10814* (2013.01); *H01L 27/10882* (2013.01)

(58) Field of Classification Search
CPC ......... H01L 21/76834; H01L 21/76883; H01L 21/02126; H01L 21/76801; H01L 21/76837; H01L 21/76885
See application file for complete search history.

(56) References Cited

U.S. PATENT DOCUMENTS

| | | | |
|---|---|---|---|
| 9,960,114 B1* | 5/2018 | Dhir | ................. H01L 21/76837 |
| 2013/0292847 A1 | 11/2013 | Choi et al. | |
| 2015/0035050 A1 | 2/2015 | Yeom et al. | |
| 2015/0056801 A1 | 2/2015 | Park et al. | |
| 2015/0340281 A1 | 11/2015 | Lee et al. | |
| 2017/0062347 A1 | 3/2017 | Kim et al. | |
| 2017/0148799 A1 | 5/2017 | Basker et al. | |
| 2018/0040561 A1 | 2/2018 | Kim et al. | |
| 2018/0226410 A1 | 8/2018 | Chang et al. | |
| 2018/0301412 A1 | 10/2018 | Borsari | |
| 2018/0342520 A1 | 11/2018 | Chun | |
| 2019/0348418 A1 | 11/2019 | Hwang et al. | |

OTHER PUBLICATIONS

Kim et al., "A Highly Manufacturable Low-k ALD-SiBN Process for 60mm NAND Flash Devices and Beyond", IEEE, 2004, United States, pp. 42.5.1-42.5.4.
U.S. Appl. No. 16/148,148, filed Oct. 1, 2018, by Iwaki et al.
U.S. Appl. No. 16/232,634, filed Dec. 26, 2018, by Sasaki.
U.S. Appl. No. 16/399,348, filed Apr. 30, 2019, by Kim et al.

* cited by examiner

METHOD USED IN FORMING INTEGRATED CIRCUITRY, AND METHOD USED IN FORMING MEMORY CIRCUITRY

TECHNICAL FIELD

Embodiments disclosed herein pertain to integrated circuitry, to DRAM circuitry, to methods used in forming integrated circuitry, and to methods used in forming memory circuitry.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

Capacitors and transistors may of course be used in integrated circuitry other than memory circuitry. Regardless, a conductive via is an elevationally-extending (e.g., vertical) conductor that is used to electrically connect upper and lower capacitors, transistors, and other integrated circuitry components together. Such may be patterned in an array.

DETAILED DESCRIPTION OF EXAMPLE EMBODIMENTS

Figure 1:
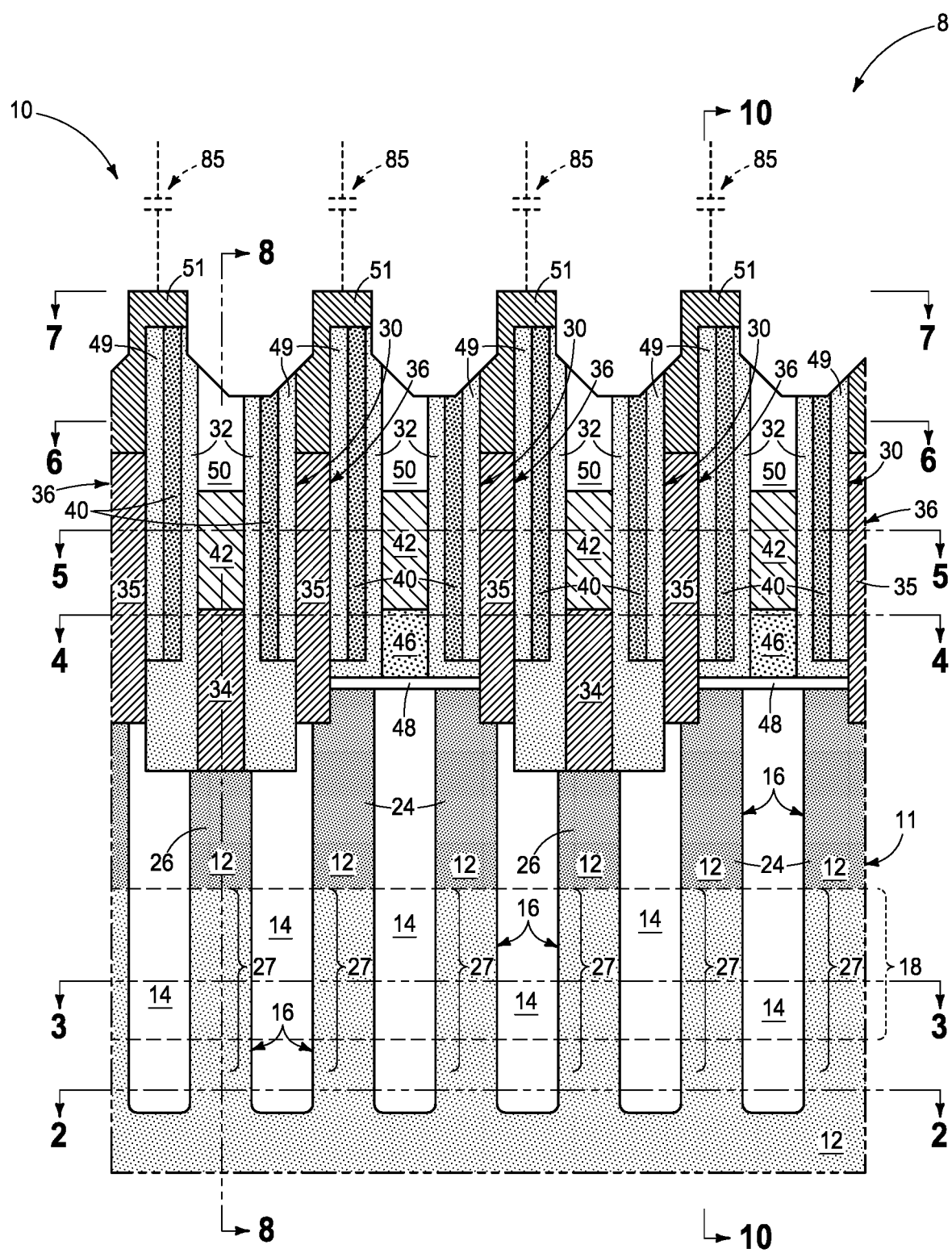
FIGS. 1-10 are diagrammatic cross-sectional views of a portion of a DRAM construction in process in accordance with some embodiments of the invention.
Figure 2:
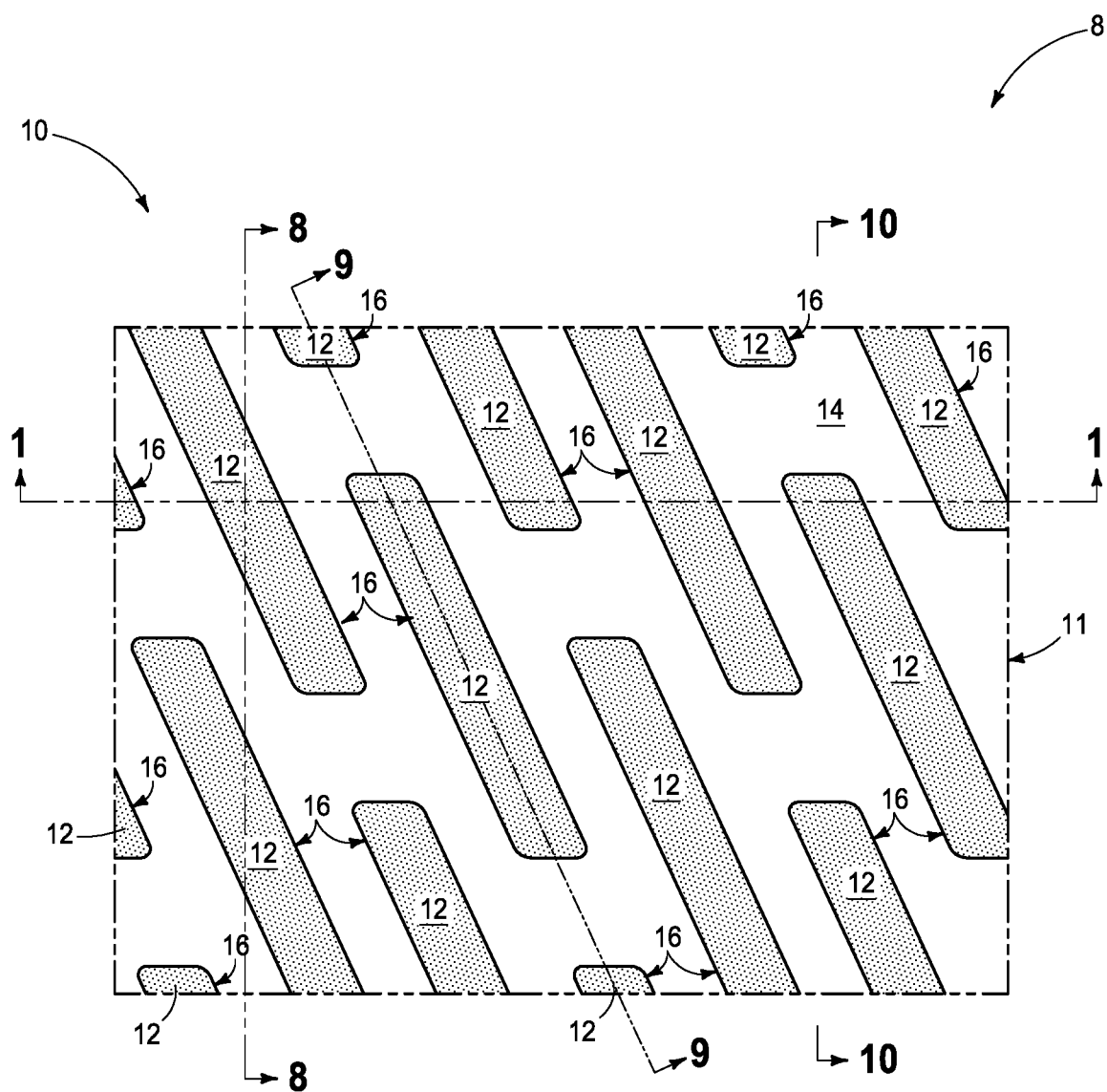
Figure 3:
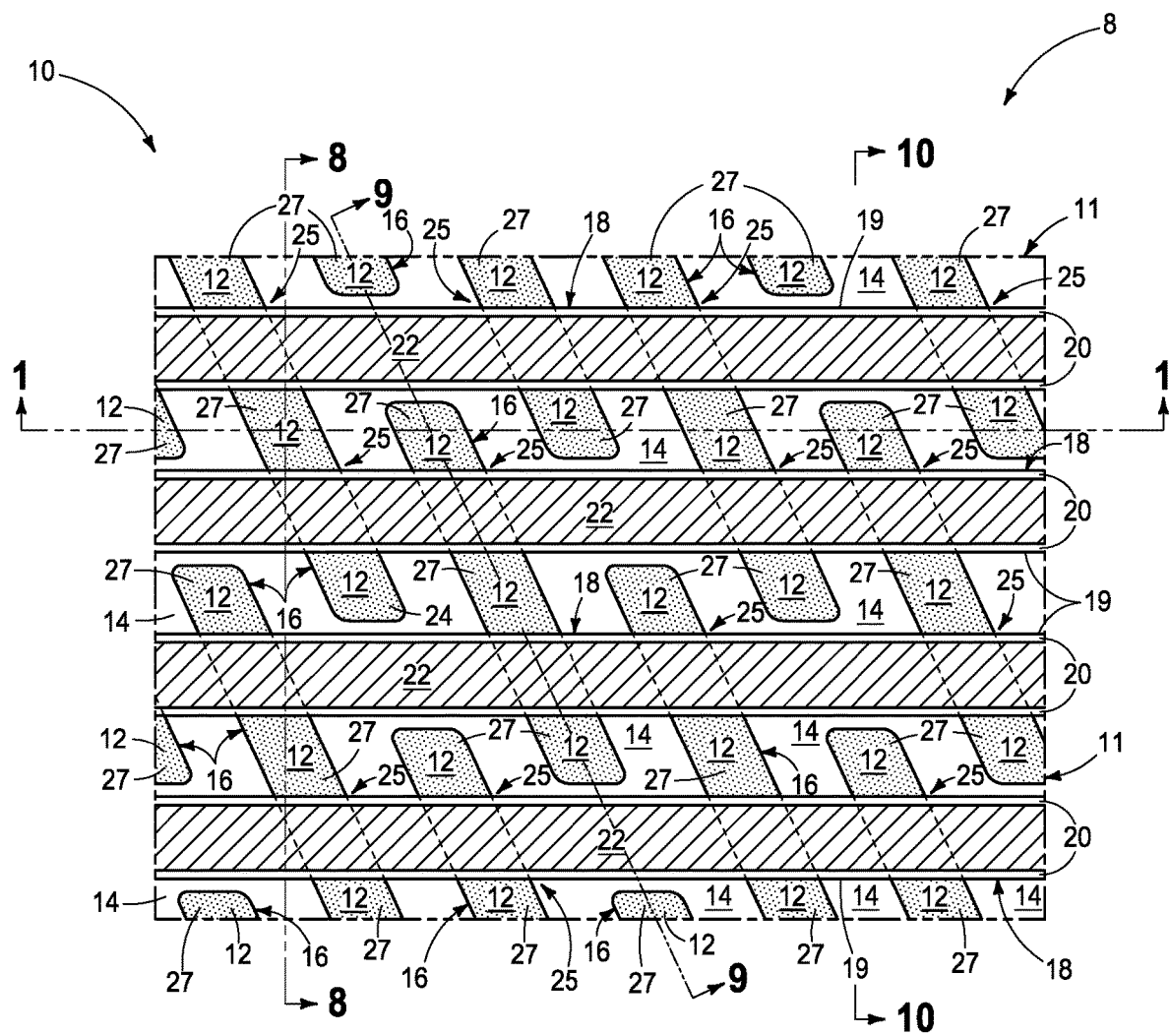
Figure 4:
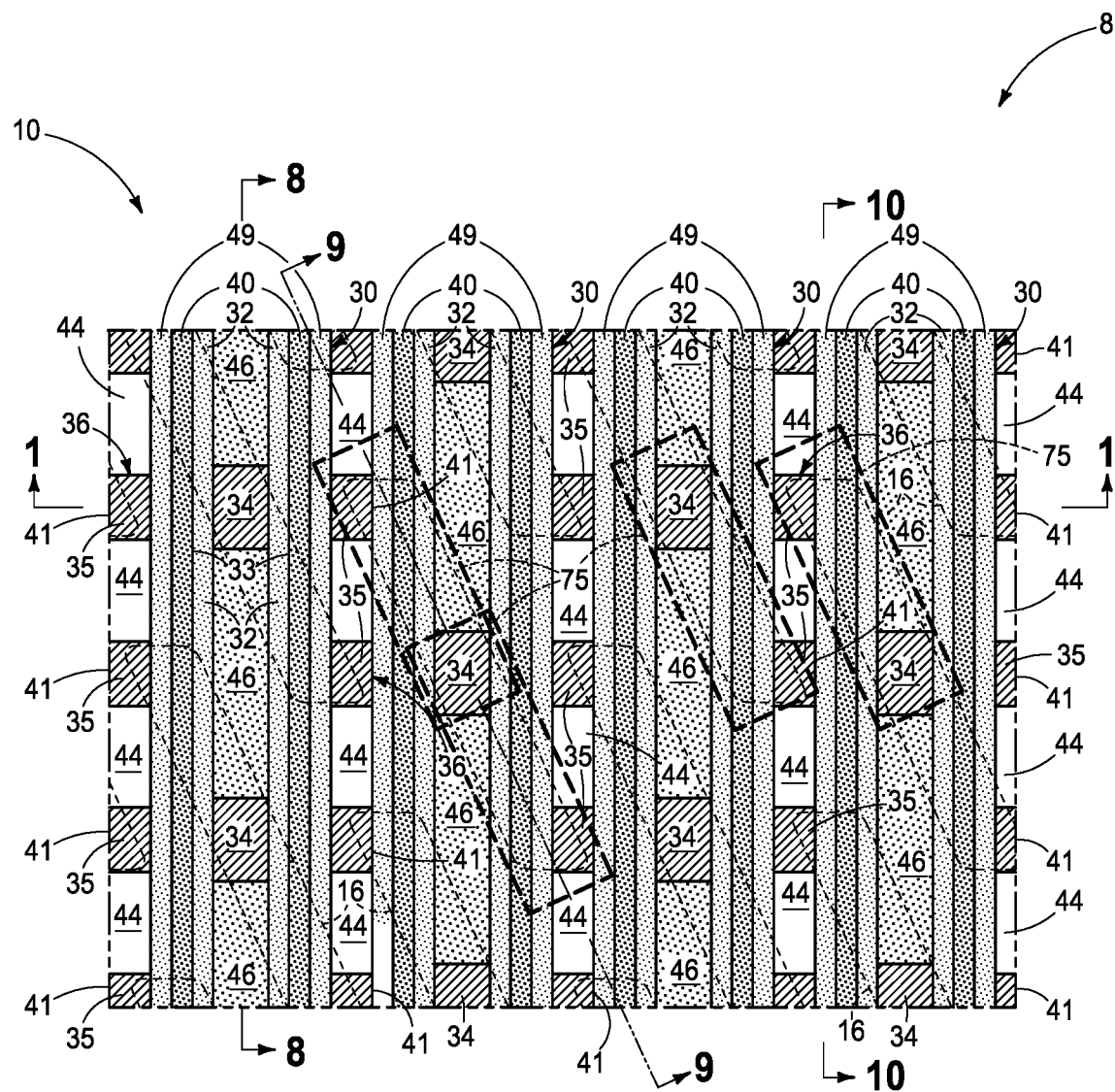
Figure 5:
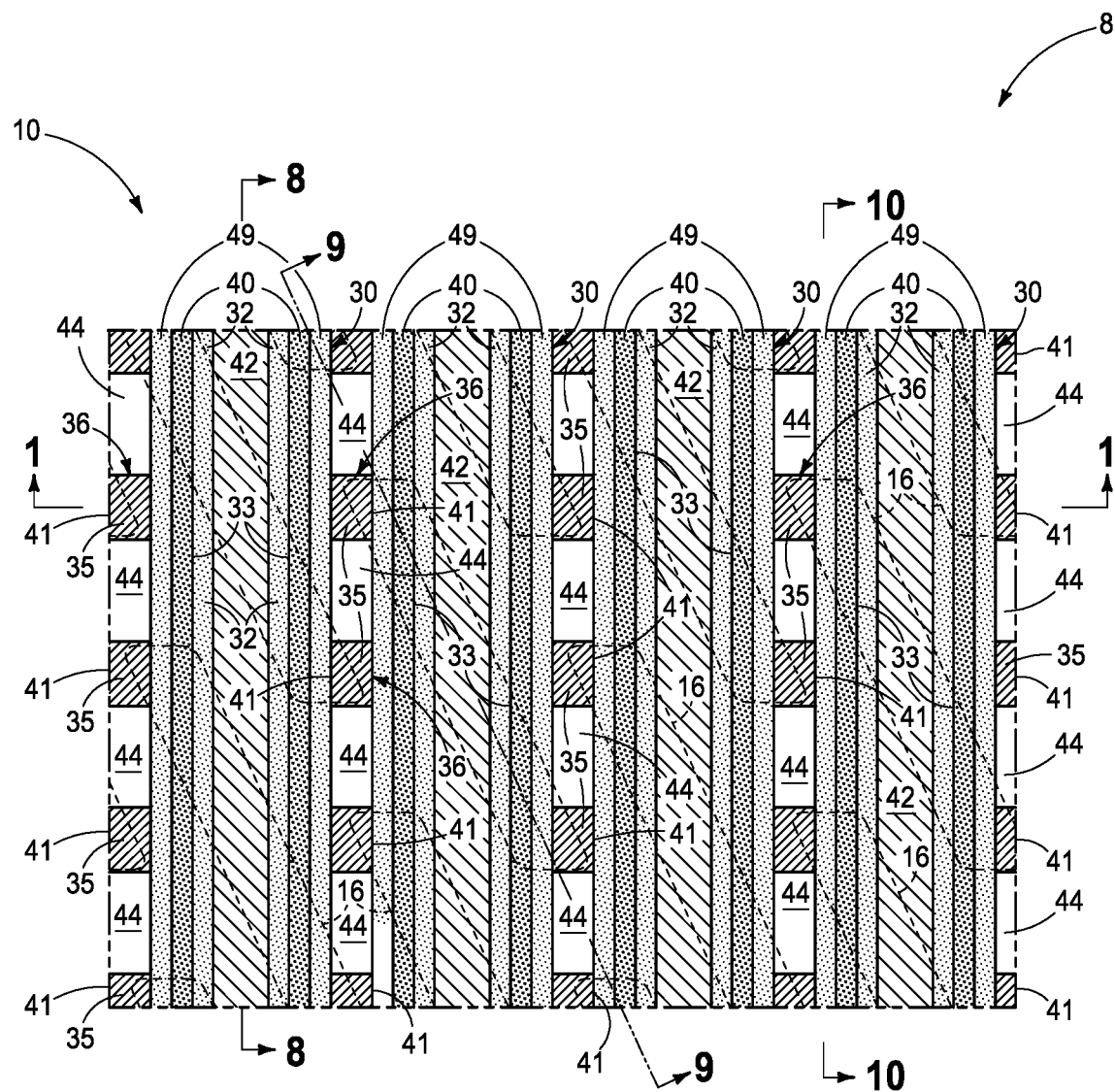
Figure 6:
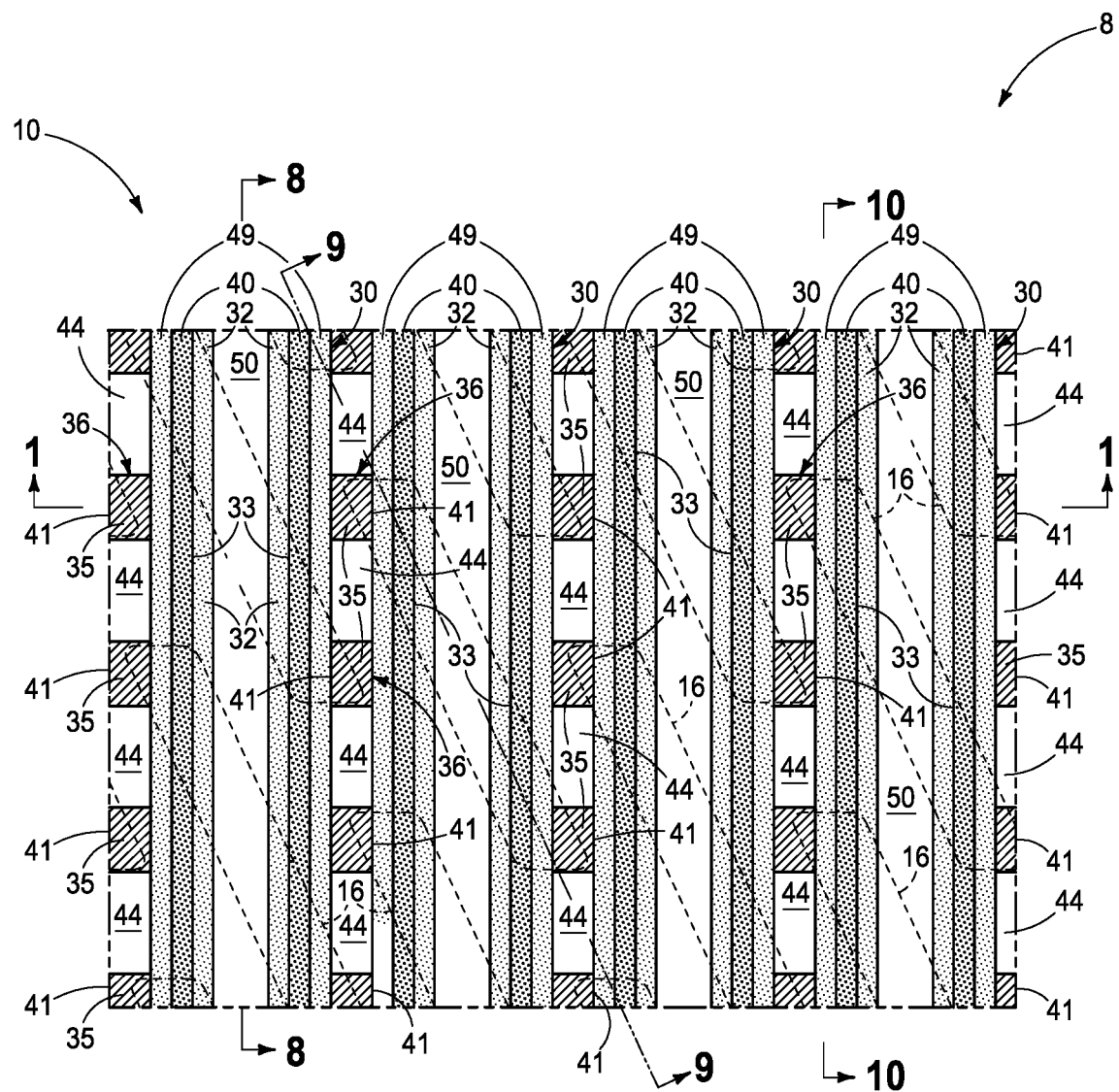
Figure 7:
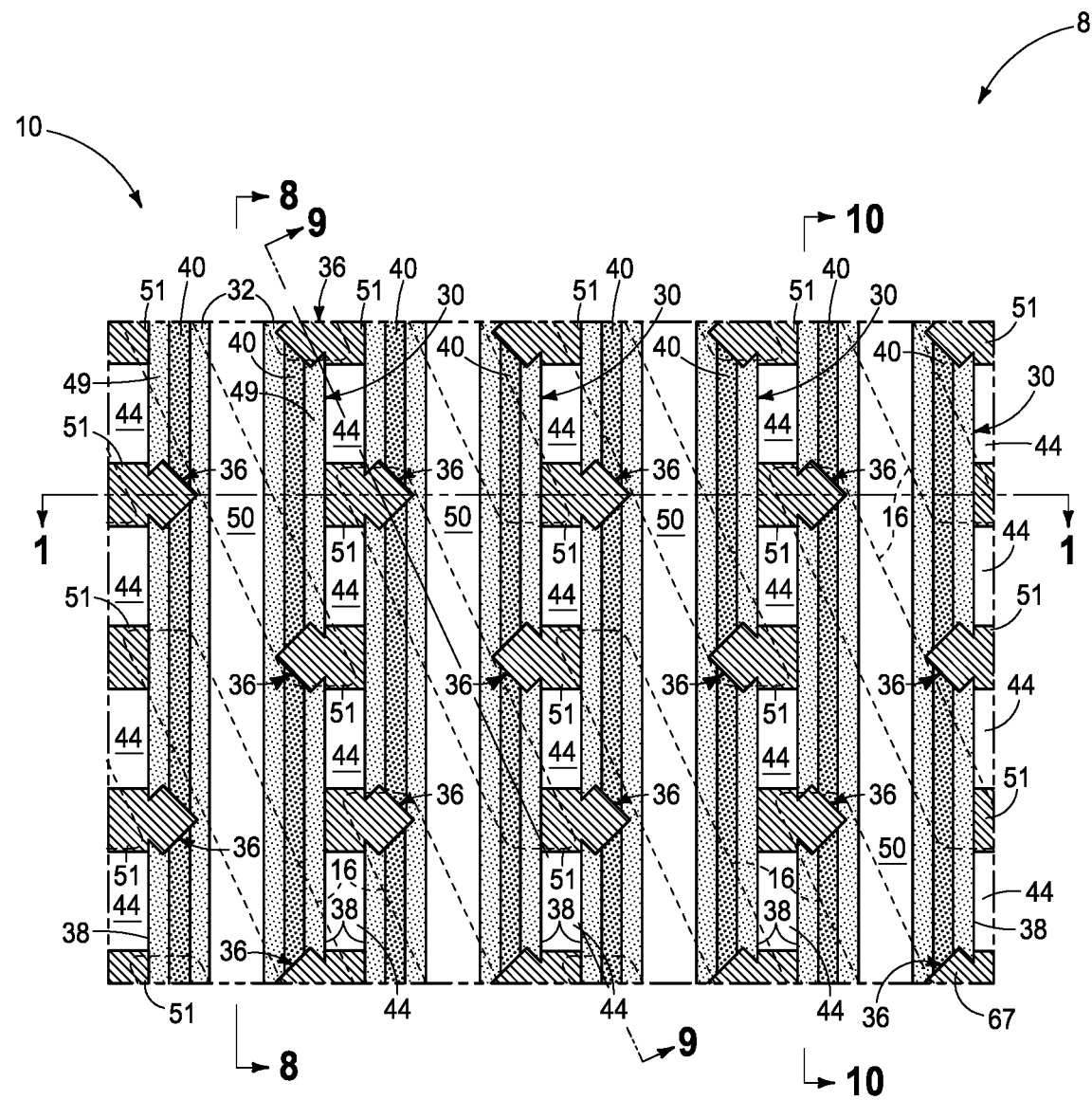
Figure 8:
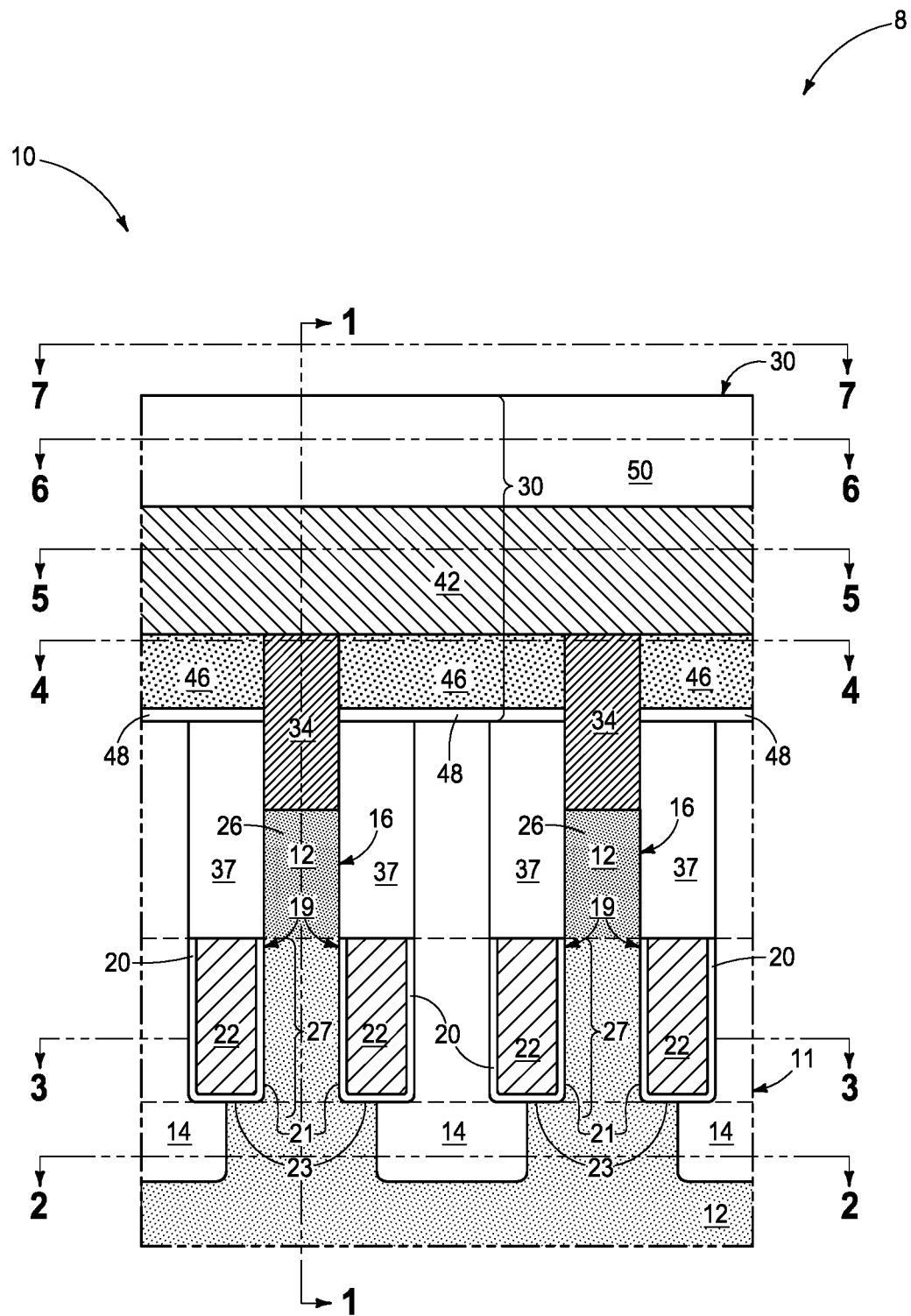

Embodiments of the invention encompass methods used in forming integrated circuitry, for example memory circuitry. Example embodiments of a method of forming DRAM circuitry are described with reference to FIGS. 1-34. Referring to FIGS. 1-10, such show an example substrate construction 8 comprising an array or array area 10 that has been fabricated relative to a base substrate 11. Substrate 11 may comprise any of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIGS. 1-10-depicted materials. For example, other partially or wholly fabricated components of integrated circuitry may be provided somewhere above, about, or within base substrate 11. Control and/or other peripheral circuitry for operating components within a memory array may also be fabricated and may or may not be wholly or partially within a memory array or sub-array. Further, multiple sub-arrays may also be fabricated and operated independently, in tandem, or otherwise relative one another. As used in this document, a "sub-array" may also be considered as an array.

Base substrate 11 comprises semiconductive material 12 (e.g., appropriately and variously doped monocrystalline and/or polycrystalline silicon, Ge, SiGe, GaAs, and/or other existing or future-developed semiconductive material), trench isolation regions 14 (e.g., silicon nitride and/or silicon dioxide), and active area regions 16 comprising suitably and variously-doped semiconductive material 12. In one embodiment, construction 8 will comprise memory cells occupying space within outlines 75 (only two outlines 75 shown in FIG. 9 and only four outlines 75 shown in FIG. 4, for clarity in such figures), for example DRAM memory cells, individually comprising a field effect transistor device 25 (FIGS. 3 and 9) and a storage element (described below). However, embodiments of the invention encompass fabricating of other memory cells and other constructions of integrated circuitry independent of whether containing memory cells.

Example transistor devices 25 individually comprise a pair of source/drain regions, a channel region between the pair of source/drain regions, a conductive gate operatively proximate the channel region, and a gate insulator between the conductive gate and the channel region. Devices 25 are shown as being recessed access devices, with example construction 8 showing such recessed access devices grouped in individual pairs of such devices. Individual recessed access devices 25 include a buried access line construction 18, for example that is within a trench 19 in semiconductive material 12. Constructions 18 comprise conductive gate material 22 (e.g., conductively-doped semiconductor material and/or metal material, including for example elemental W, Ru, and/or Mo) that functions as a conductive gate of individual devices 25. A gate insulator 20 (e.g., silicon dioxide and/or silicon nitride) is along sidewalls 21 and a base 23 of individual trenches 19 between conductive gate material 22 and semiconductive material 12. Insulator material 37 (e.g., silicon dioxide and/or silicon nitride) is within trenches 19 above materials 20 and 22. Individual devices 25 comprise a pair of source/drain regions 24, 26 in upper portions of semiconductive material 12 on opposing sides of individual trenches 19 (e.g., regions 24, 26 being laterally outward of and higher than buried access line constructions 18). Each of source/drain regions 24, 26 has at least a part thereof having a conductivity-increasing dopant therein that is of maximum concentration of such conductivity-increasing dopant within the respective source/drain region 24, 26, for example to render such part to be conductive (e.g., having a maximum dopant concentration of at least $10^{19}$ atoms/cm$^3$). Accordingly, all or only a part of each source/drain region 24, 26 may have such maximum concentration of conductivity-increasing dopant. Source/drain regions 24 and/or 26 may include other doped regions (not shown), for example halo regions, LDD regions, etc.

One of the source/drain regions (e.g., region 26) of the pair of source/drain regions in individual of the pairs of recessed access devices 25 is laterally between conductive gate material 22 and is shared by the pair of devices 25. Others of the source/drain regions (e.g., regions 24) of the pair of source/drain regions are not shared by the pair of devices 25. Thus, in the example embodiment, each active area region 16 comprises two devices 25 (e.g., one pair of devices 25), with each sharing a central source/drain region 26.

An example channel region 27 (FIGS. 1, 3, and 8-10) is in semiconductive material 12 below pair of source/drain regions 24, 26 along trench sidewalls 21 (FIGS. 8-10) and around trench base 23. Channel region 27 may be undoped or may be suitably doped with a conductivity-increasing dopant likely of the opposite conductivity-type of the dopant in source/drain regions 24, 26, and for example that is at a maximum concentration in the channel of no greater than $1 \times 10^{17}$ atoms/cm$^3$. When suitable voltage is applied to gate material 22 of an access line construction 18, a conductive channel forms (e.g., along a channel current-flow line/path 29 [FIG. 9]) within channel region 27 proximate gate insulator 20 such that current is capable of flowing between a pair of source/drain regions 24 and 26 under the access line construction 18 within an individual active area region 16. Stippling in semiconductive material 12 is diagrammatically shown to indicate primary conductivity-modifying dopant concentration (regardless of type), with denser stippling indicating greater dopant concentration and lighter stippling indicating lower dopant concentration. Conductivity-modifying dopant may be, and would likely be, in other portions of material 12 as shown. Only two different stippling densities are shown in material 12 for convenience, and additional dopant concentrations may be used, and constant dopant concentration is not required in any region.

In one embodiment, digitline structures 30 have been formed and that individually directly electrically couple to the one shared source/drain region 26 of multiple of the individual pairs of devices 25. Digitline structures 30 comprise conductive material 42. Elevationally-extending conductive vias 34 are spaced longitudinally along digitline structures 30 and extend downwardly from conductive material 42. Conductive vias 34 individually directly electrically couple digitline structures 30 to individual of shared source/drain regions 26 of the individual pairs of devices 25. Doped or undoped semiconductor material 46 is between immediately-longitudinally-adjacent conductive vias 34. Lower insulative material 48 (e.g., one or more of silicon dioxide, silicon nitride, aluminum dioxide, hafnium oxide, etc.; e.g., thickness of 50 to 200 Angstroms) is below semiconductor material 46 between immediately-longitudinally-adjacent conductive vias 34. As alternate examples, material 46 may comprise insulative material or metal material or be eliminated, with conductive material 42 extending inwardly to lower insulative material 48 (not shown). Example digitline structures 30 comprise an insulator-material cap 50 (e.g., silicon nitride).

Figure 9:
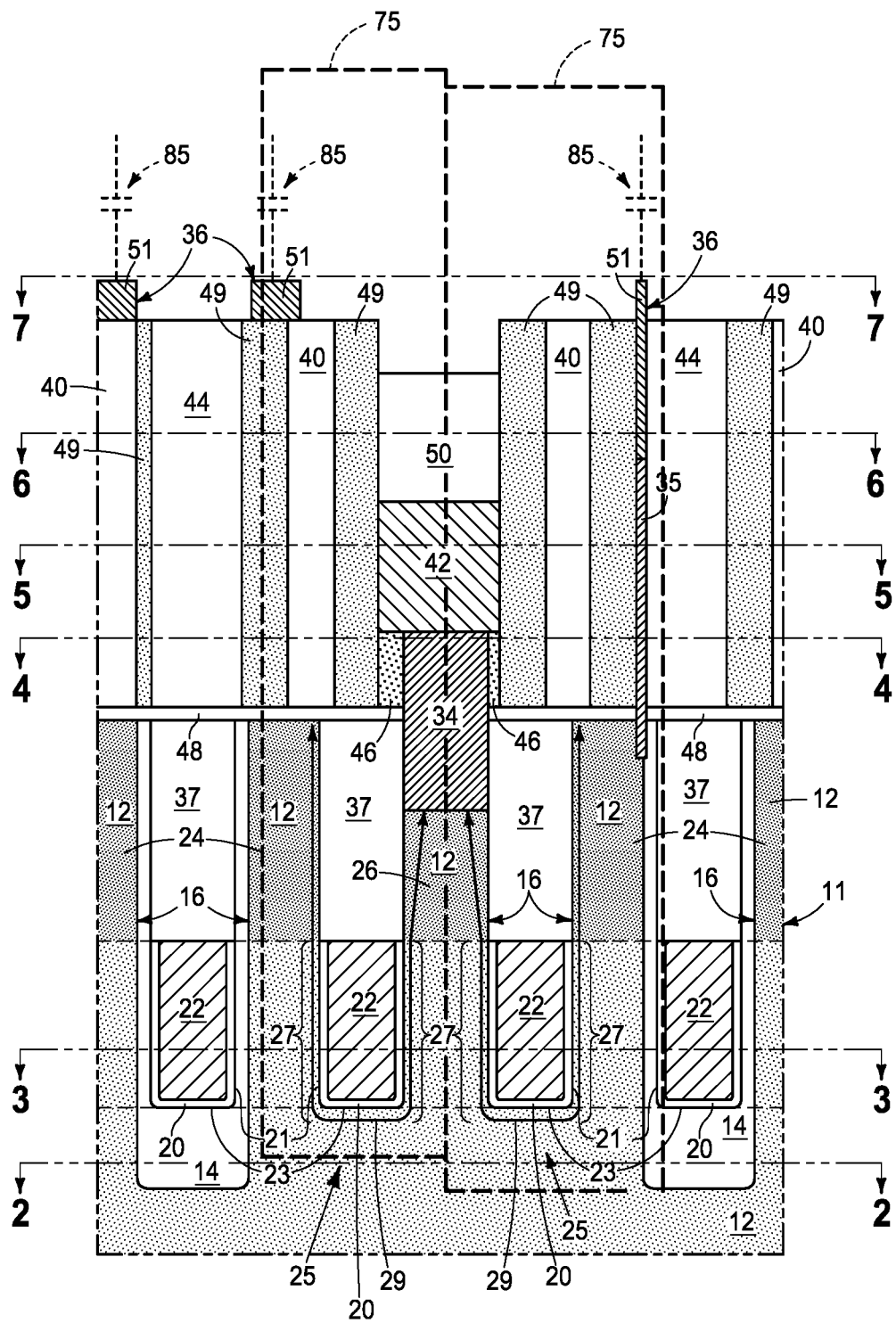
Figure 10:
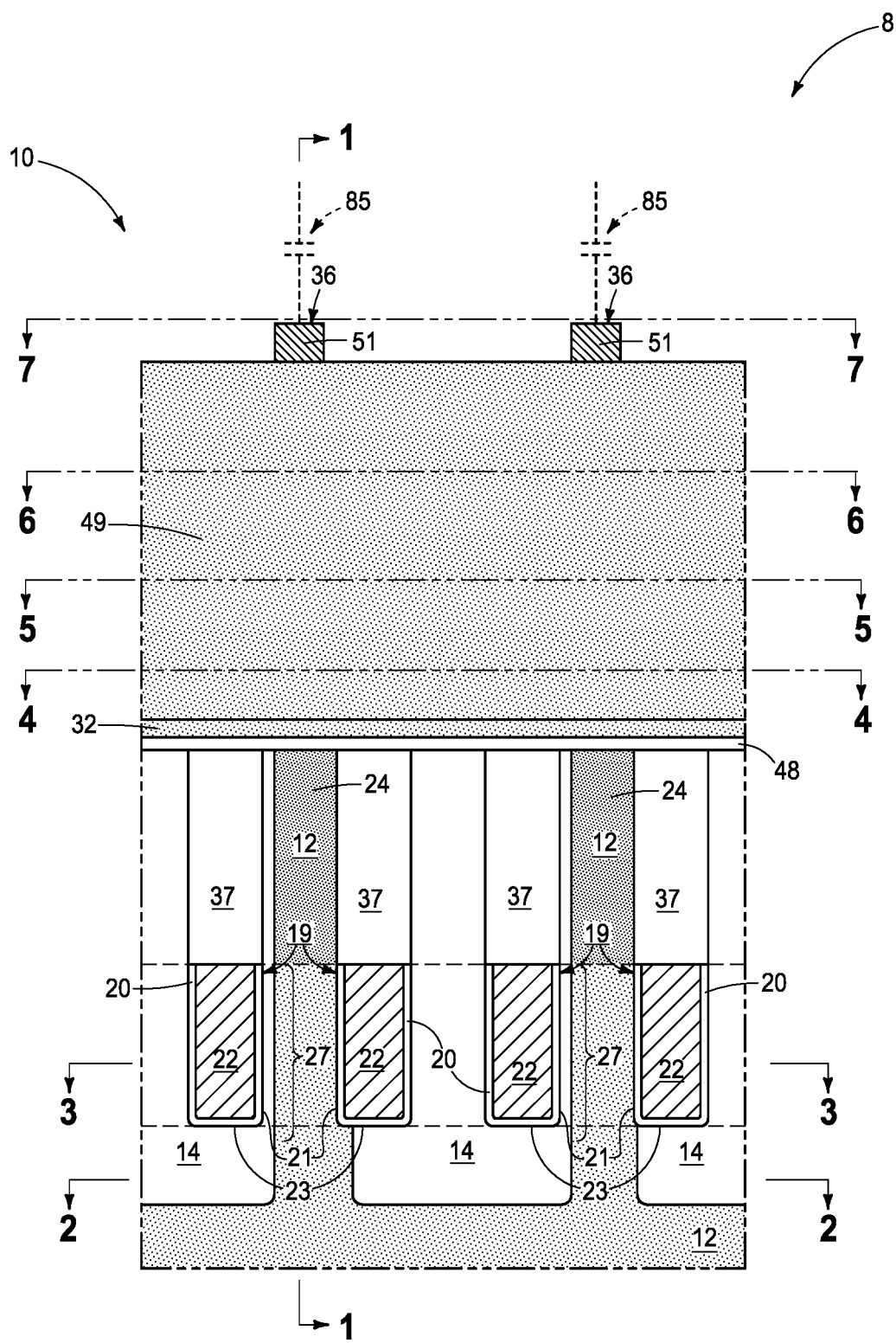
Figure 11:
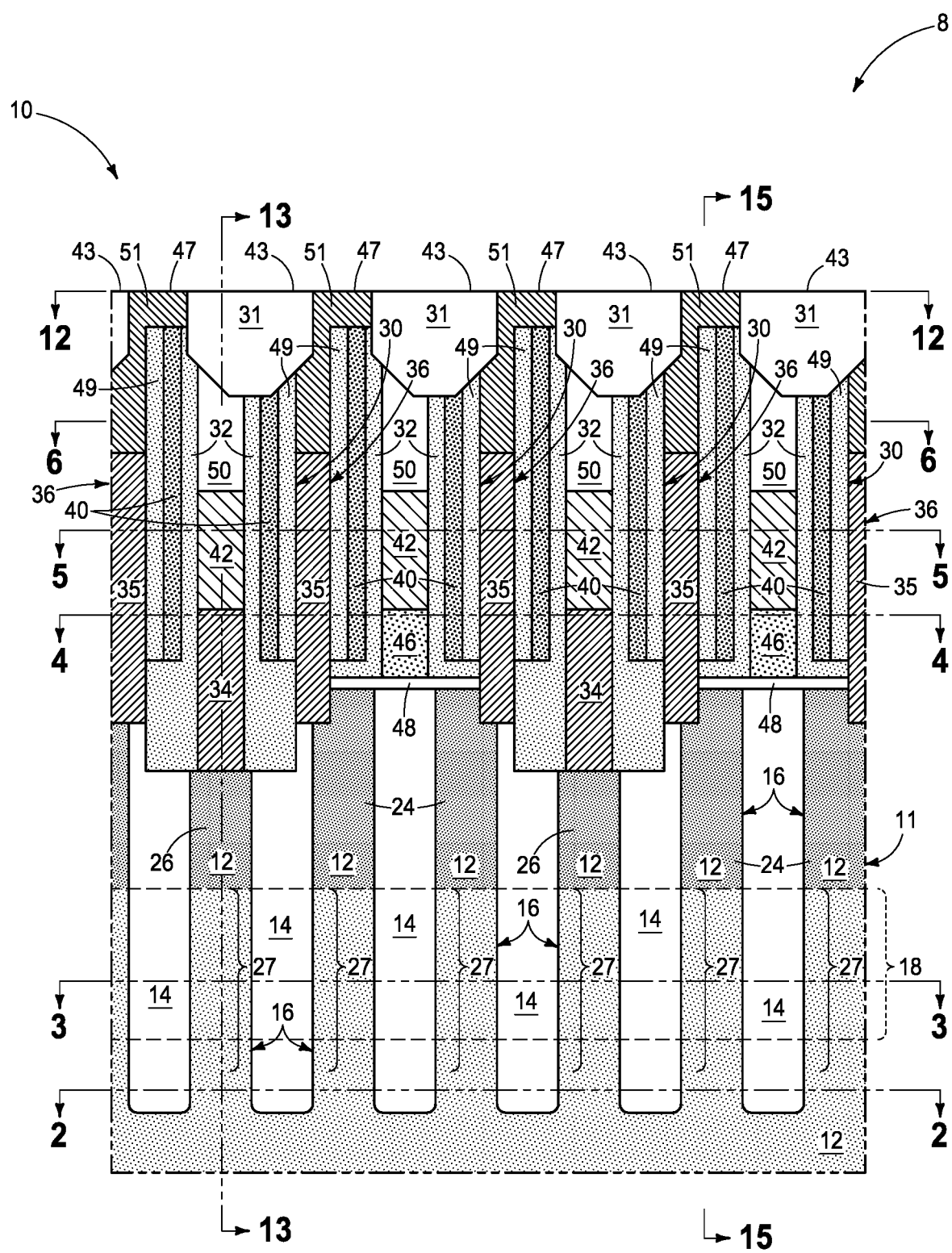
FIGS. 11-34 are diagrammatic sequential sectional views of the construction of FIGS. 1-10 in process in accordance with some embodiments of the invention.
Figure 12:
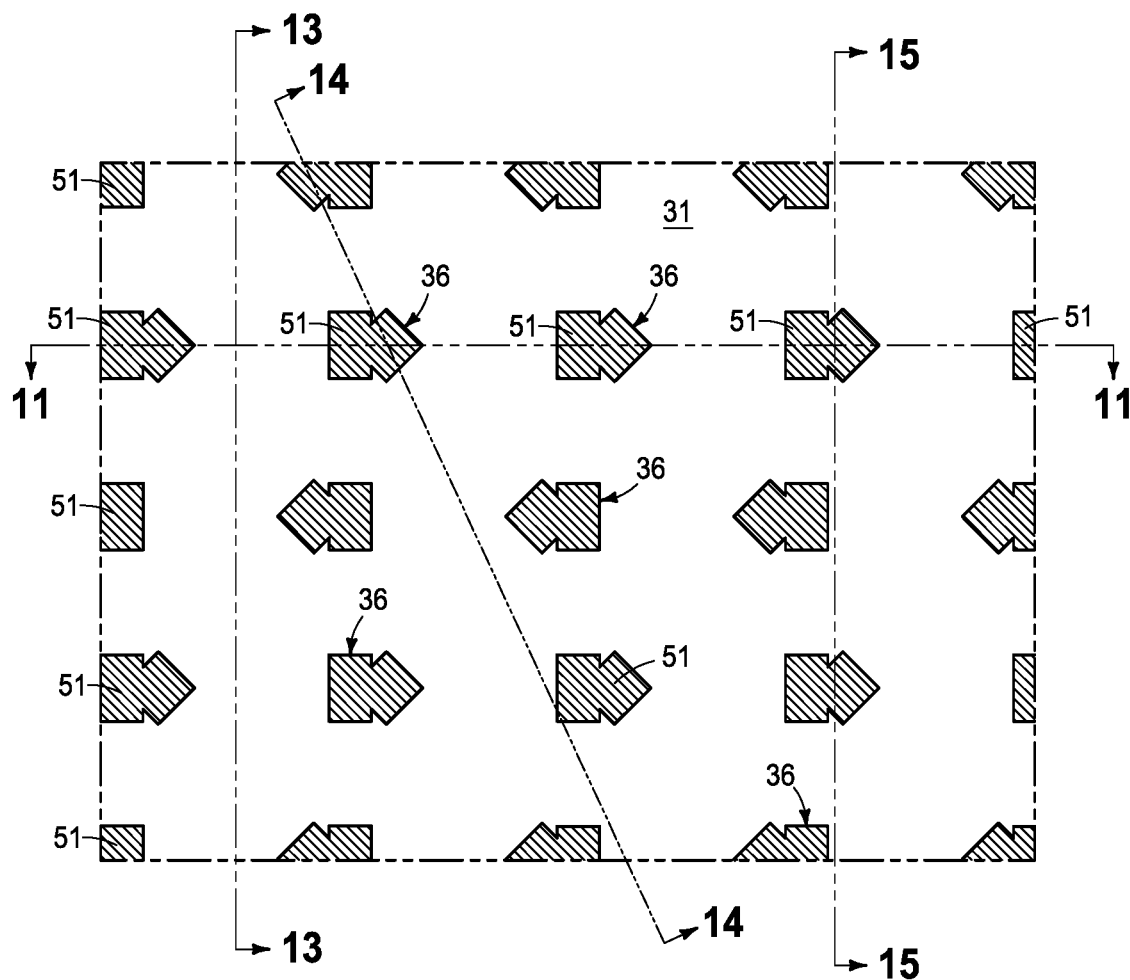
Figure 13:
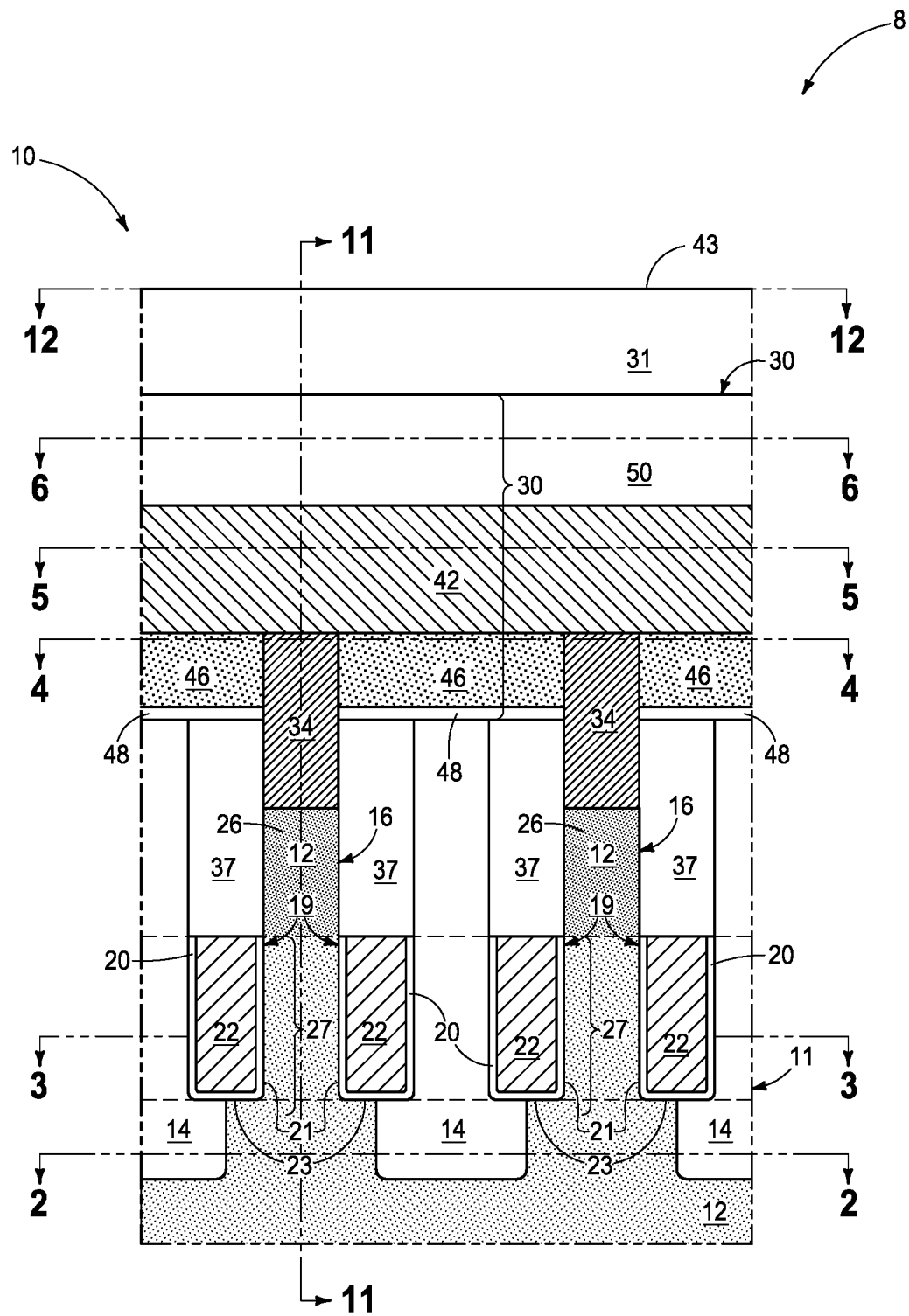
Figure 14:
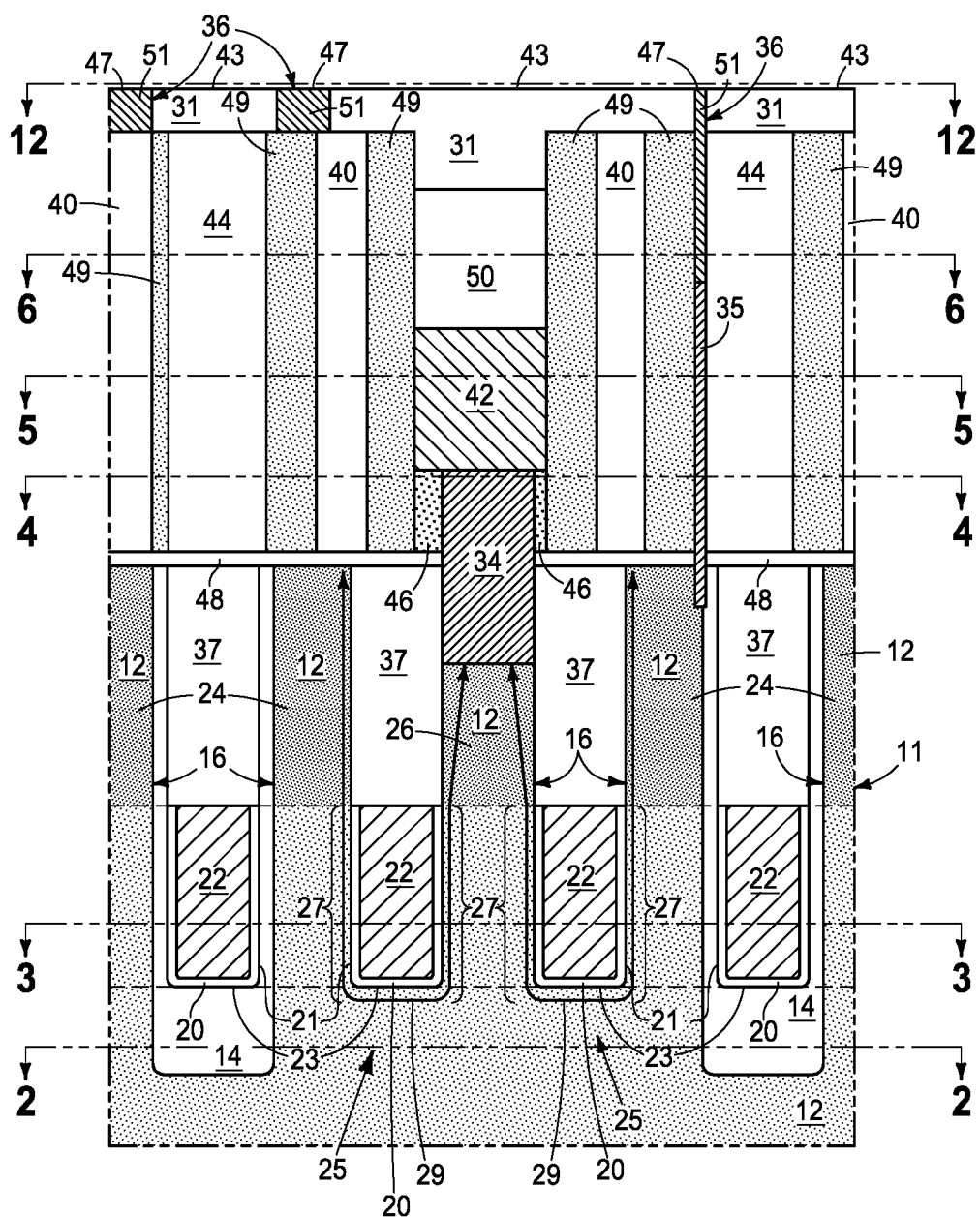
Figure 15:
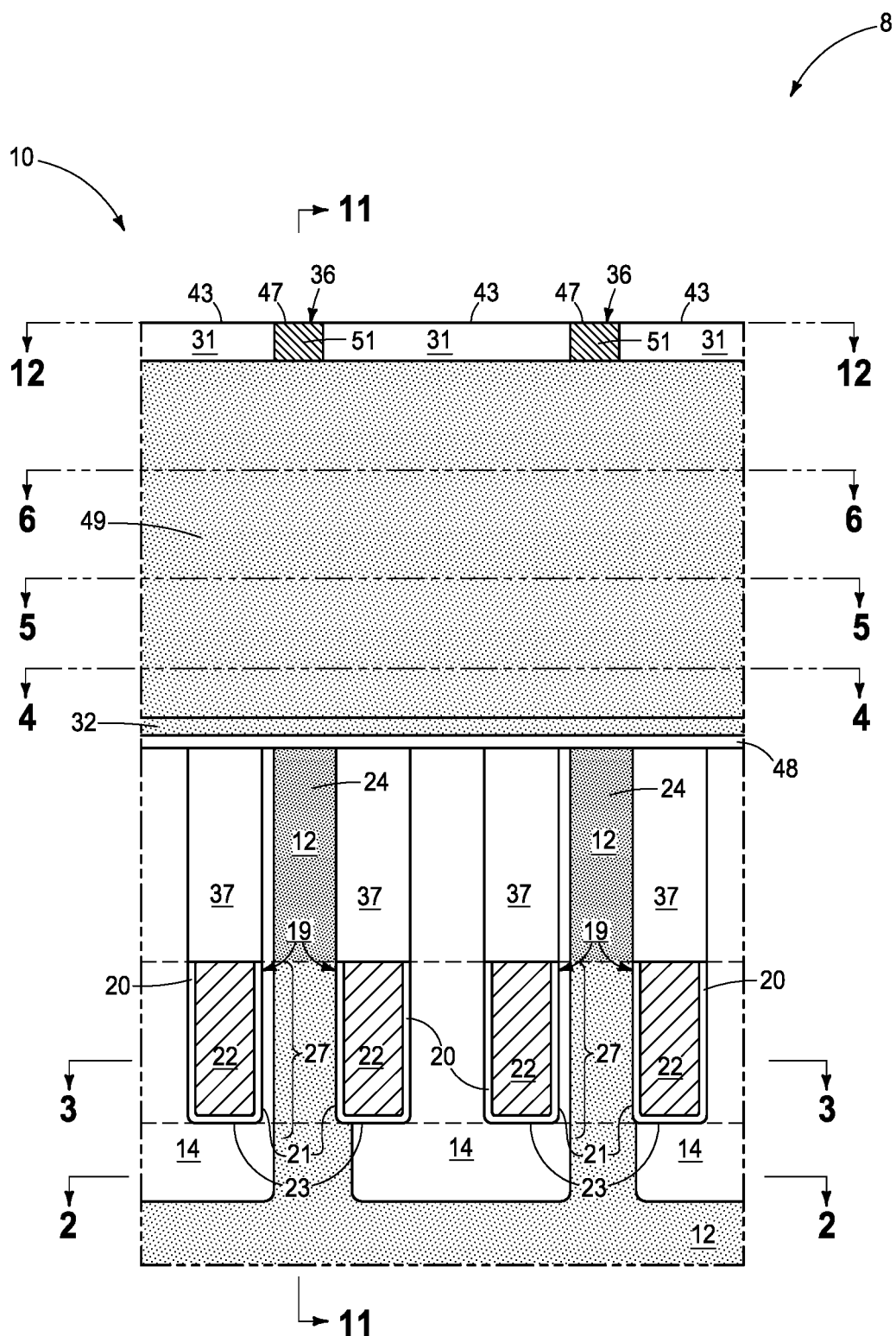
Figure 16:
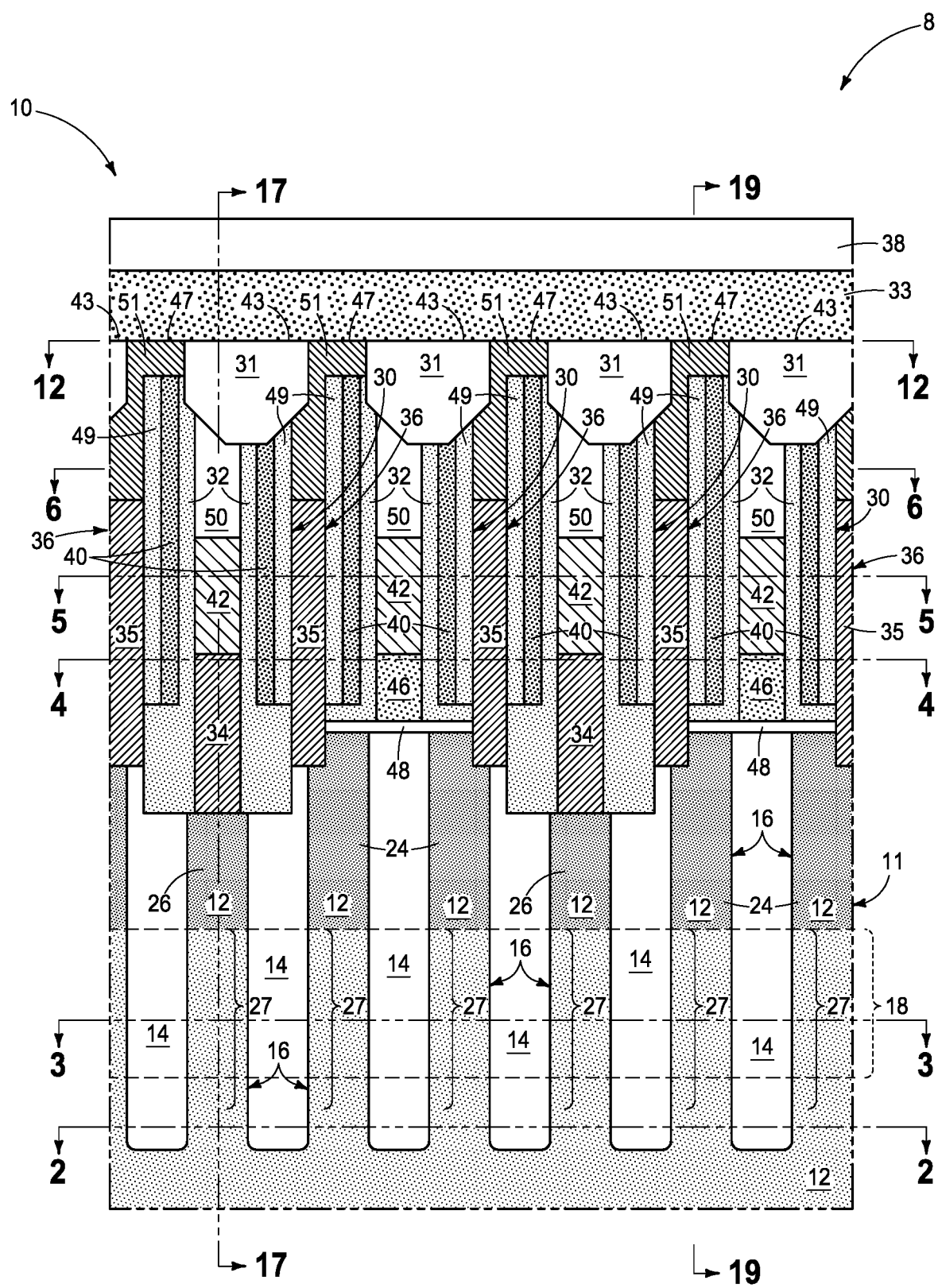
Figure 17:
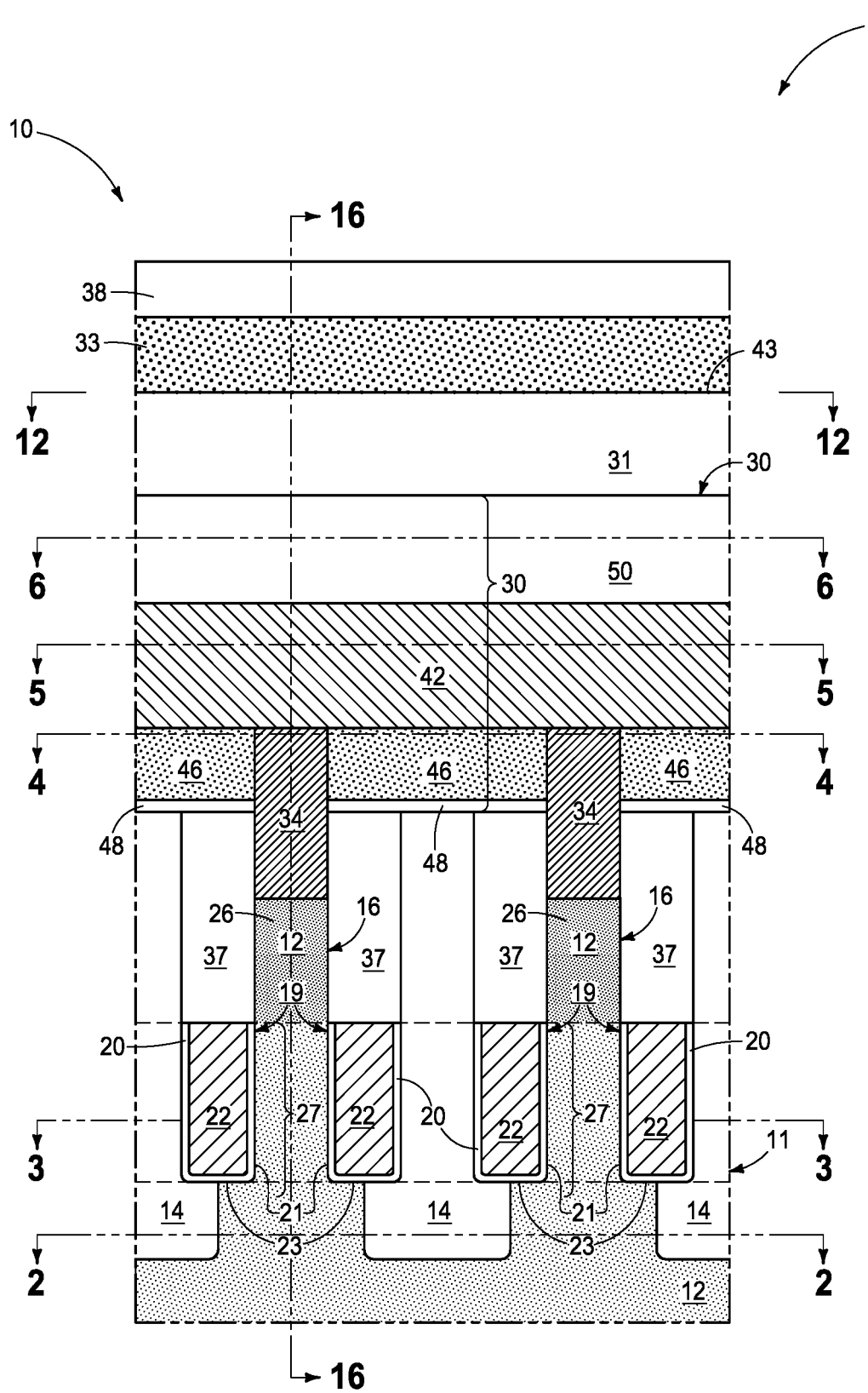
Figure 18:
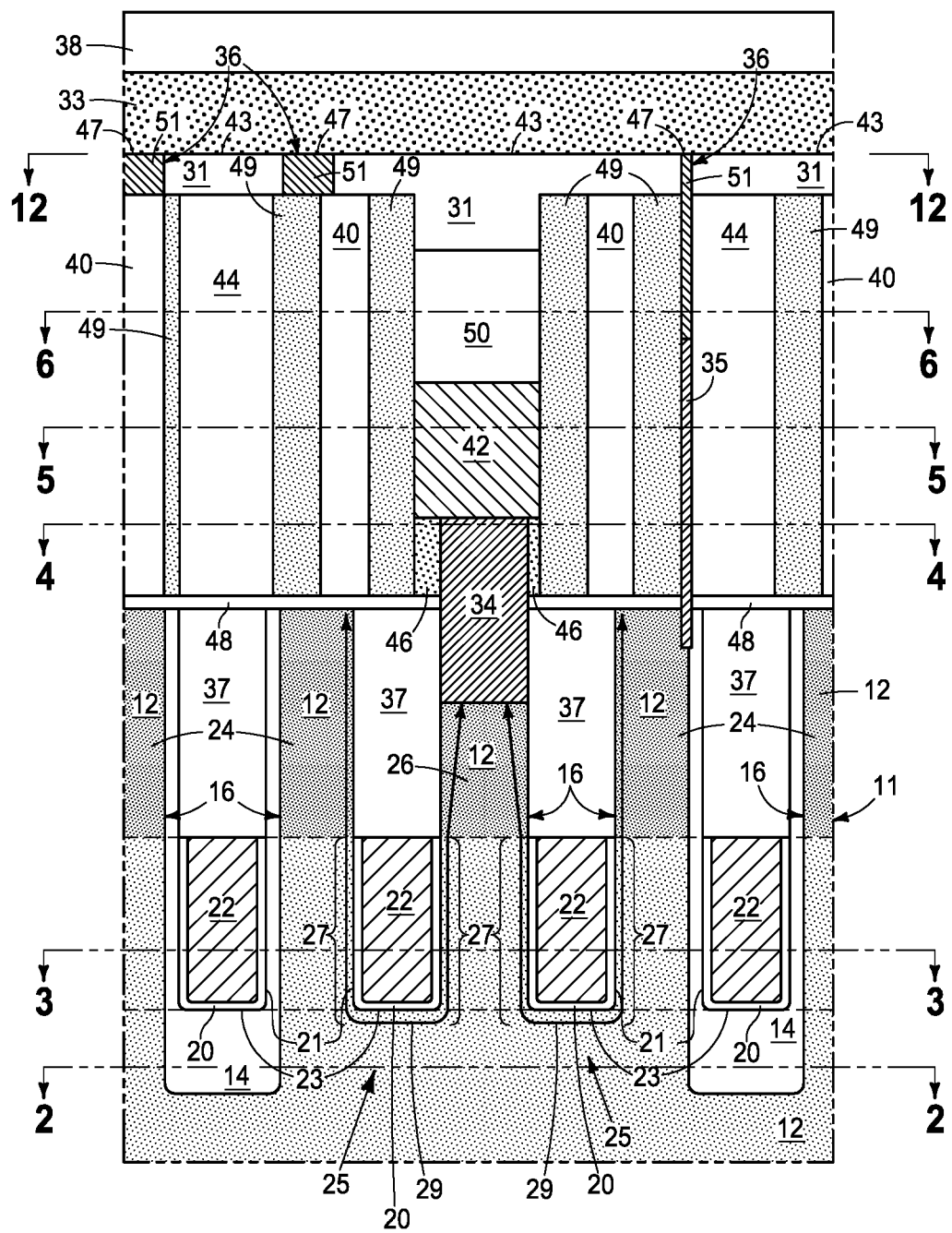
Figure 19:
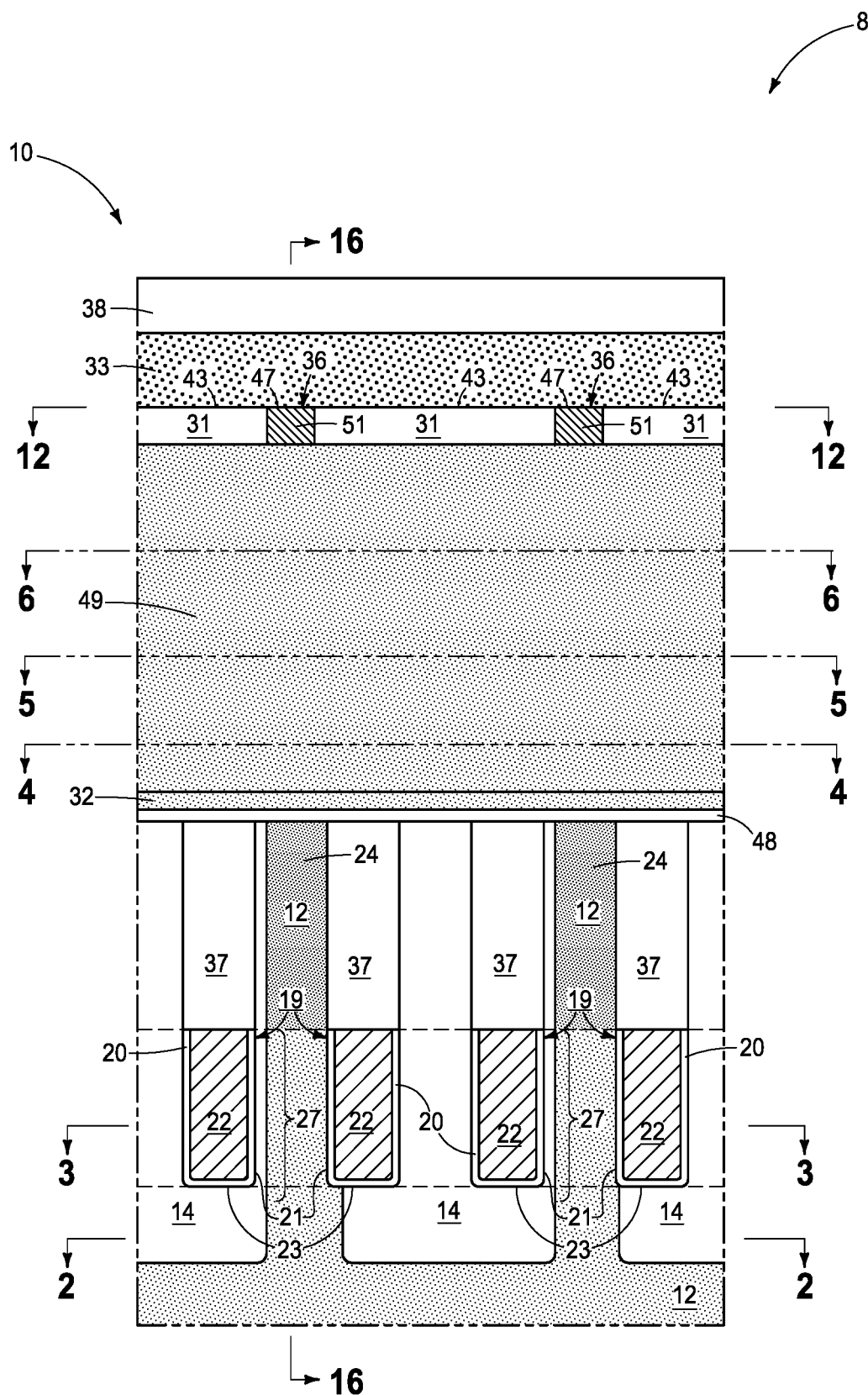
Figure 20:
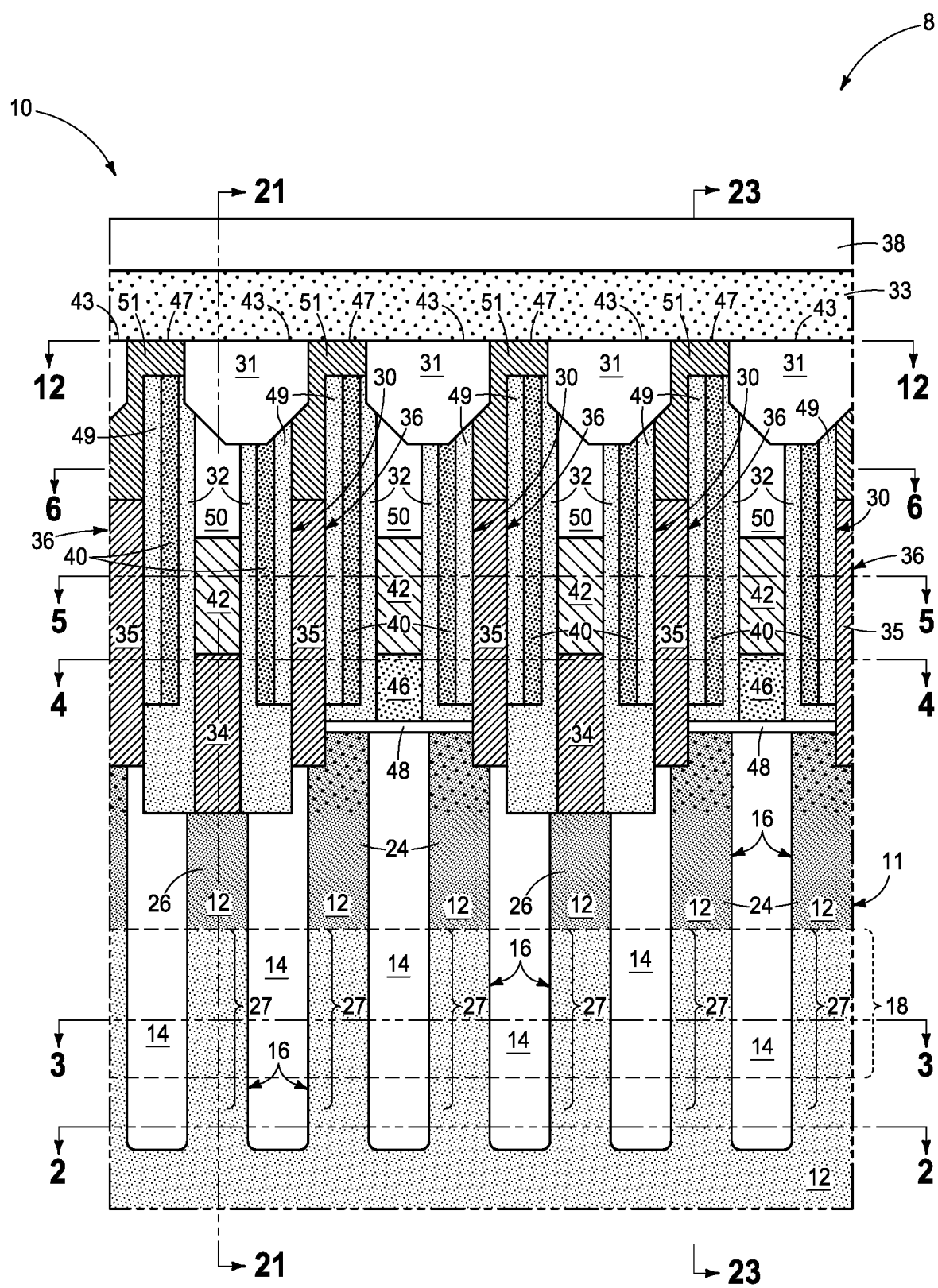
Figure 21:
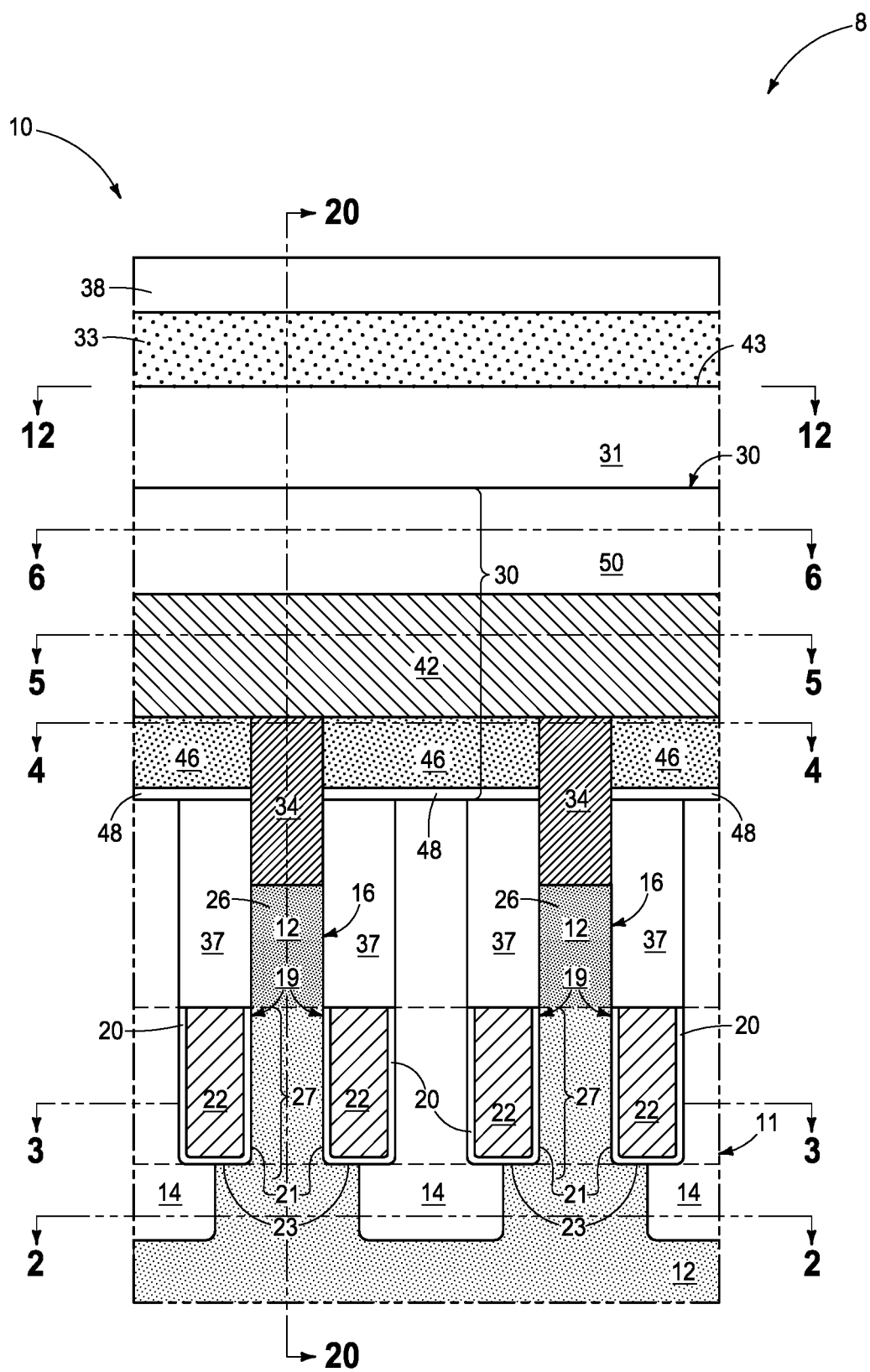
Figure 22:
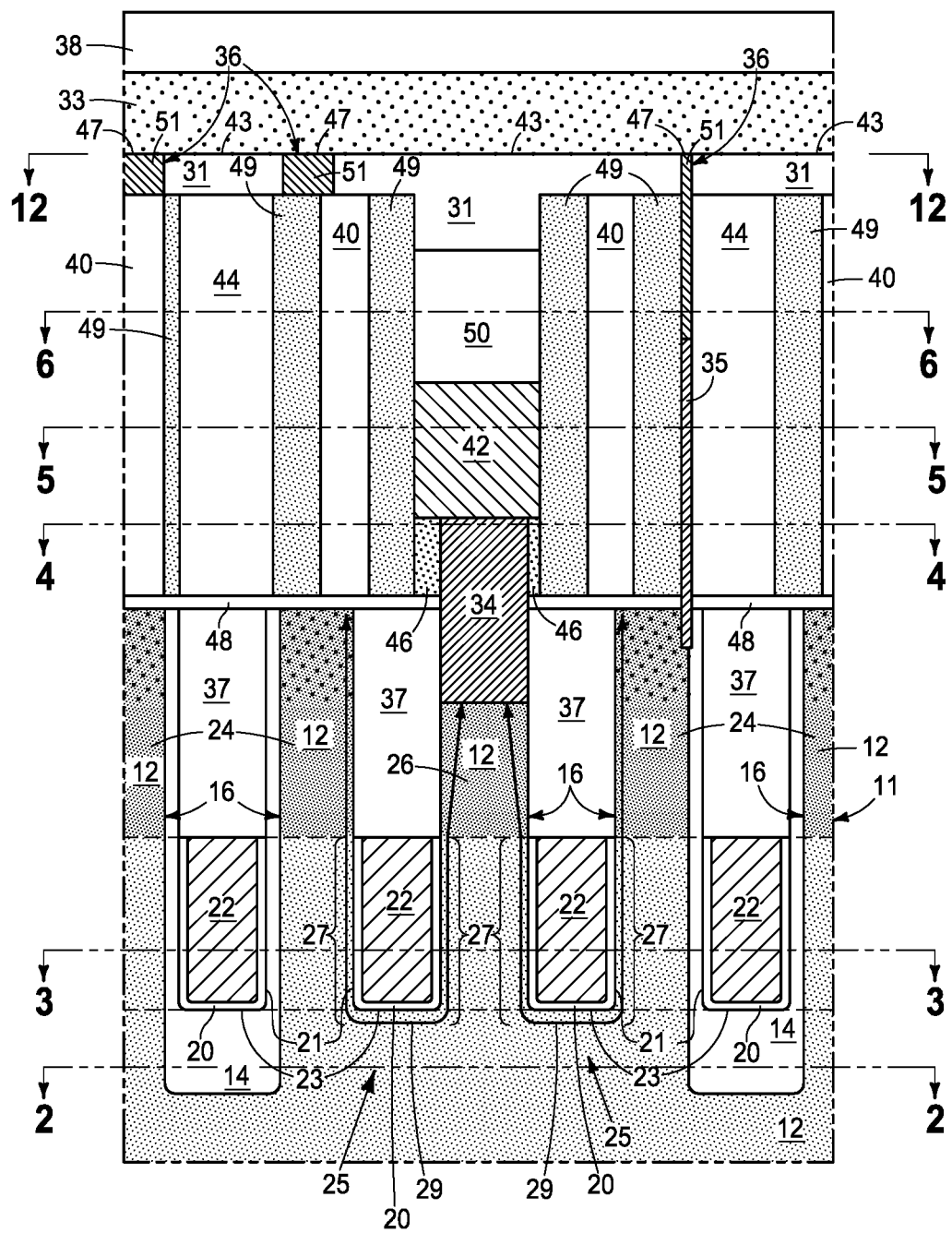
Figure 23:
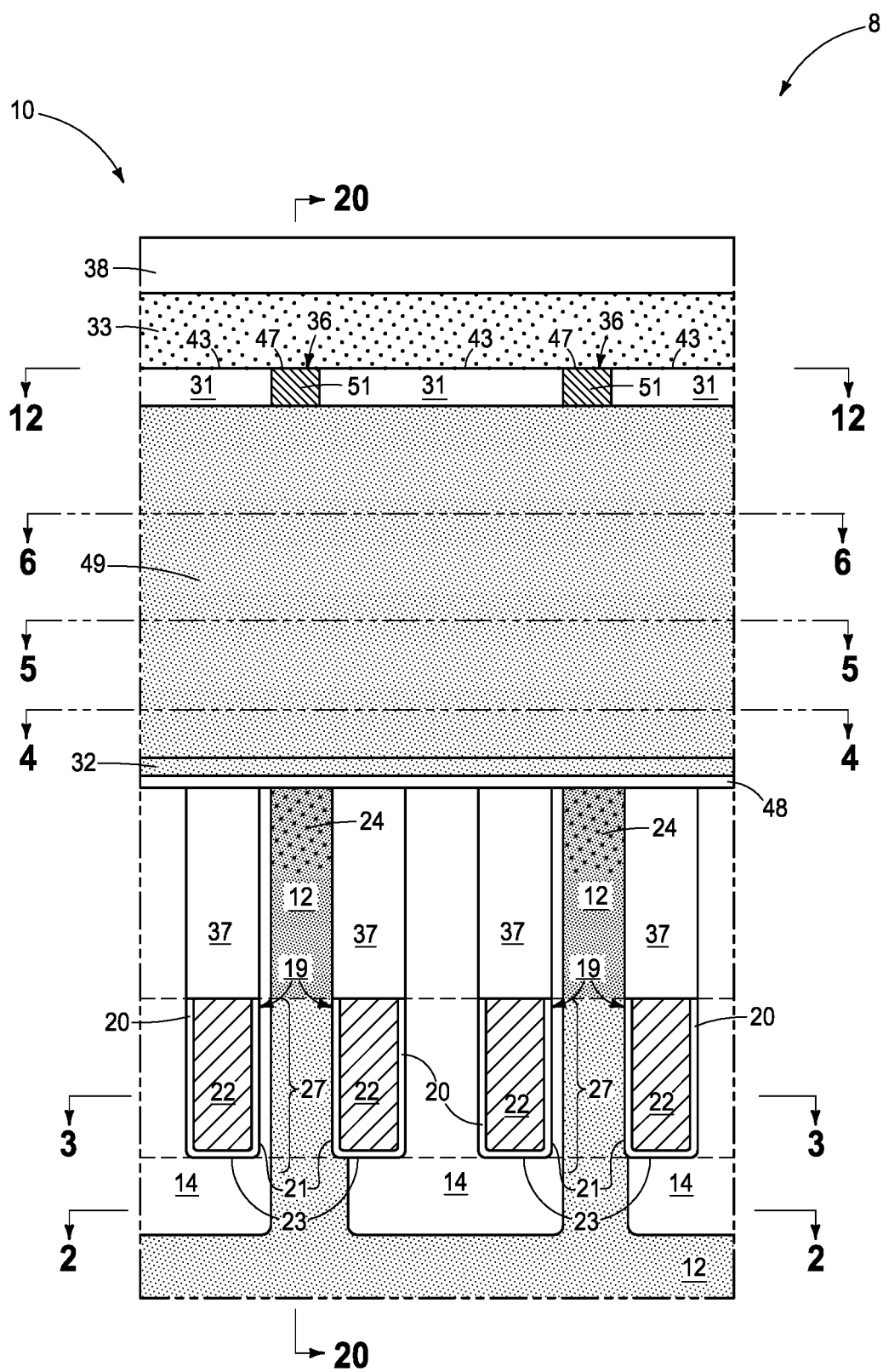
Figure 24:
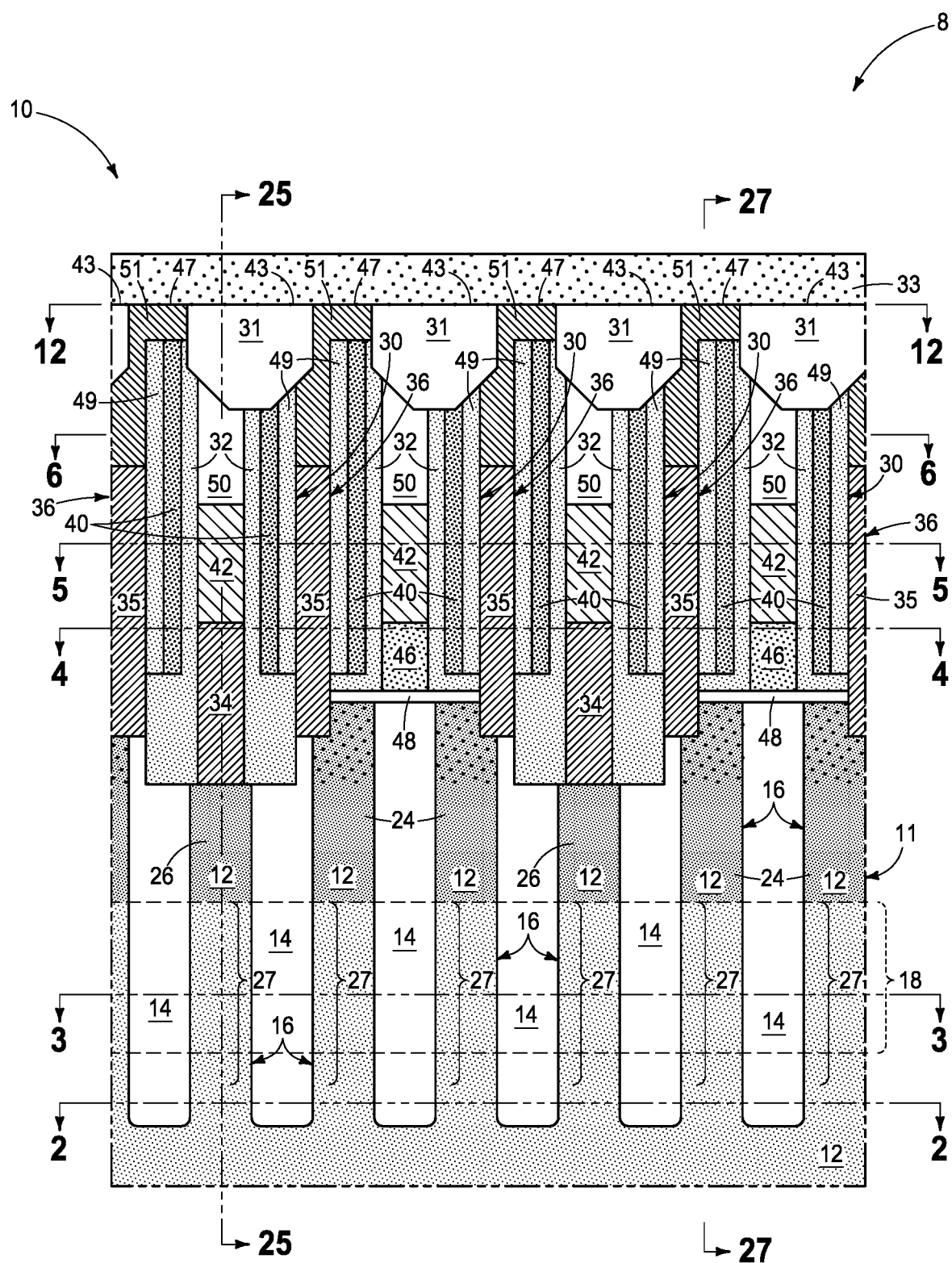
Figure 25:
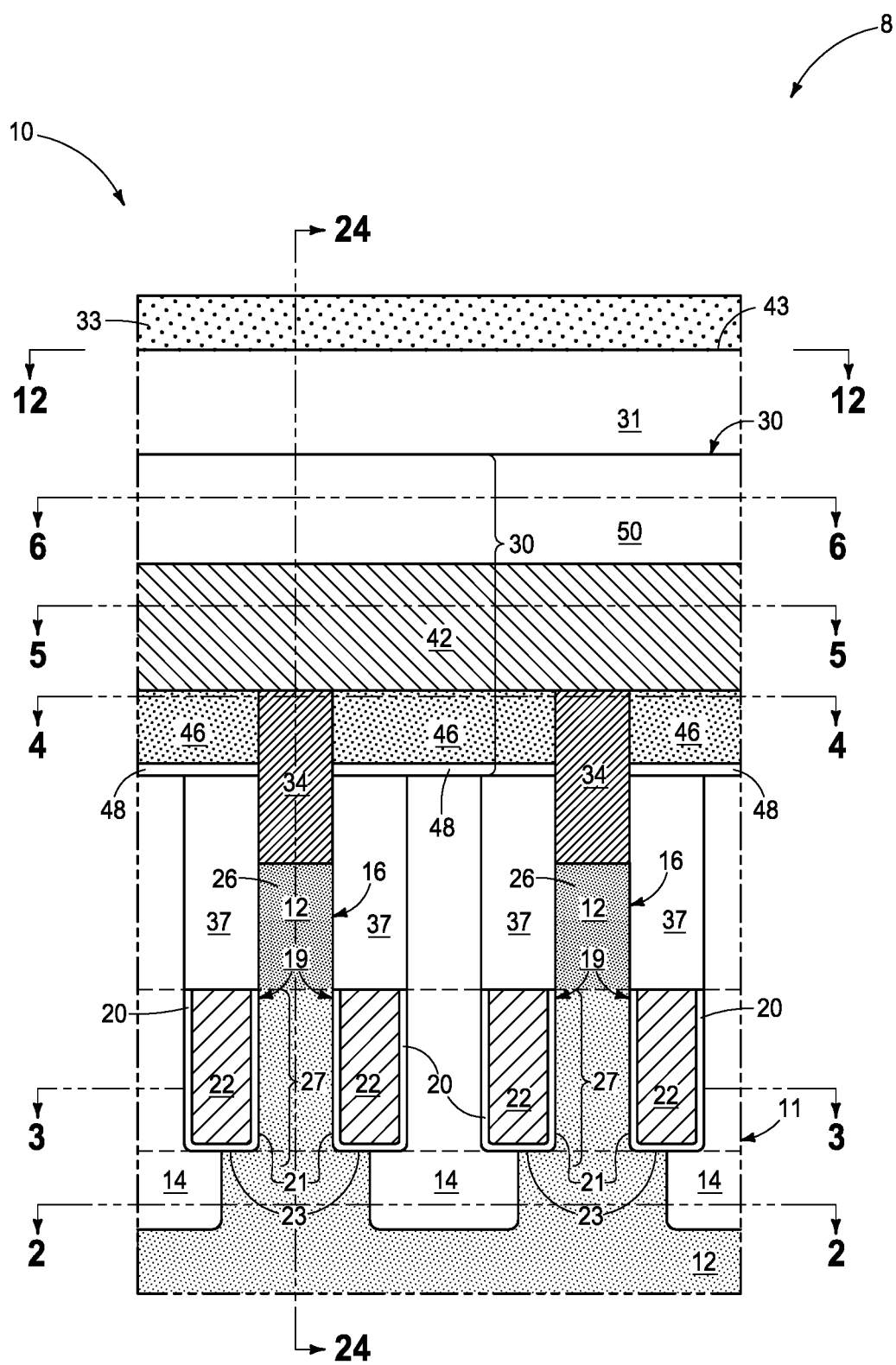
Figure 26:
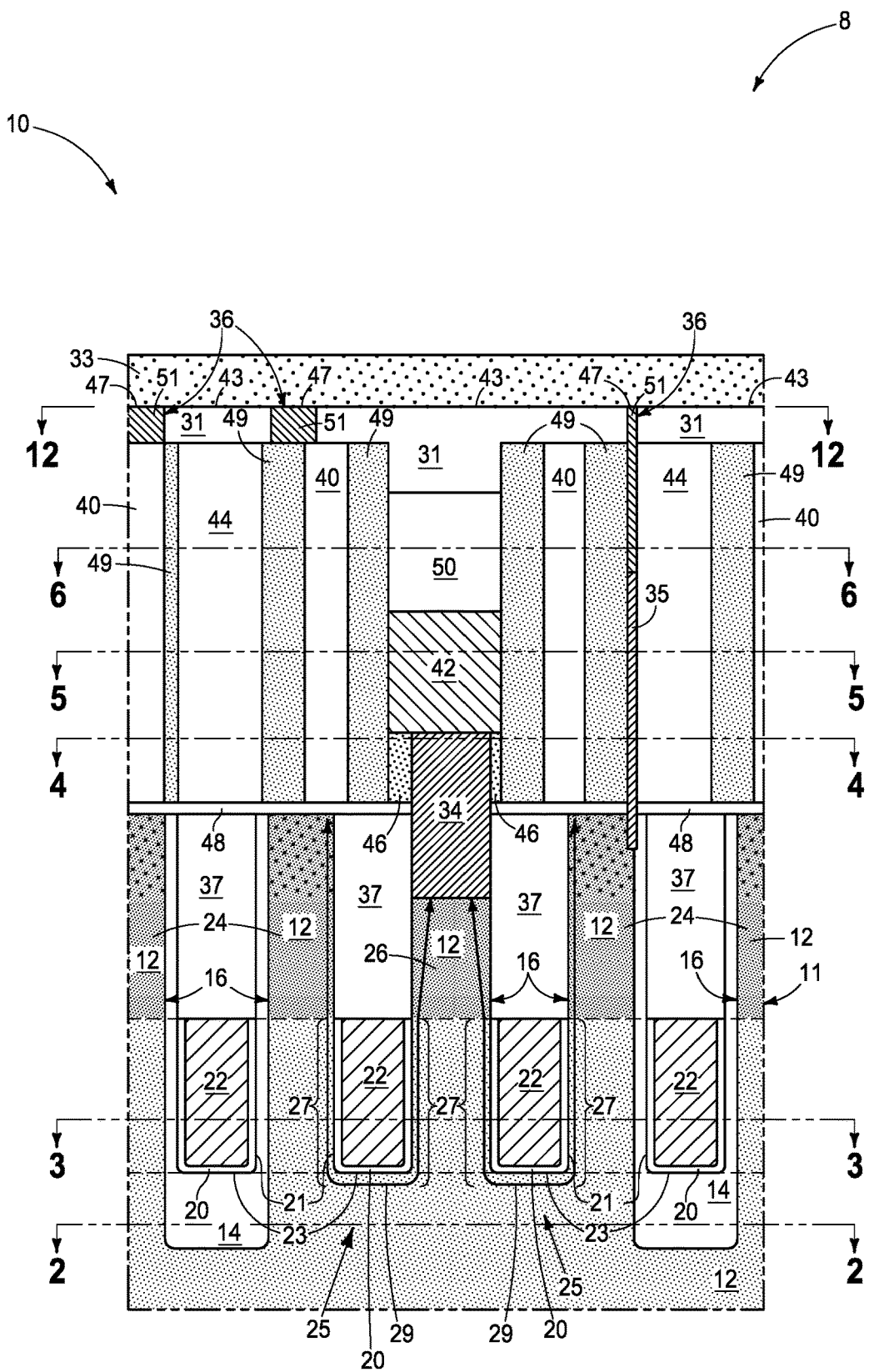
Figure 27:
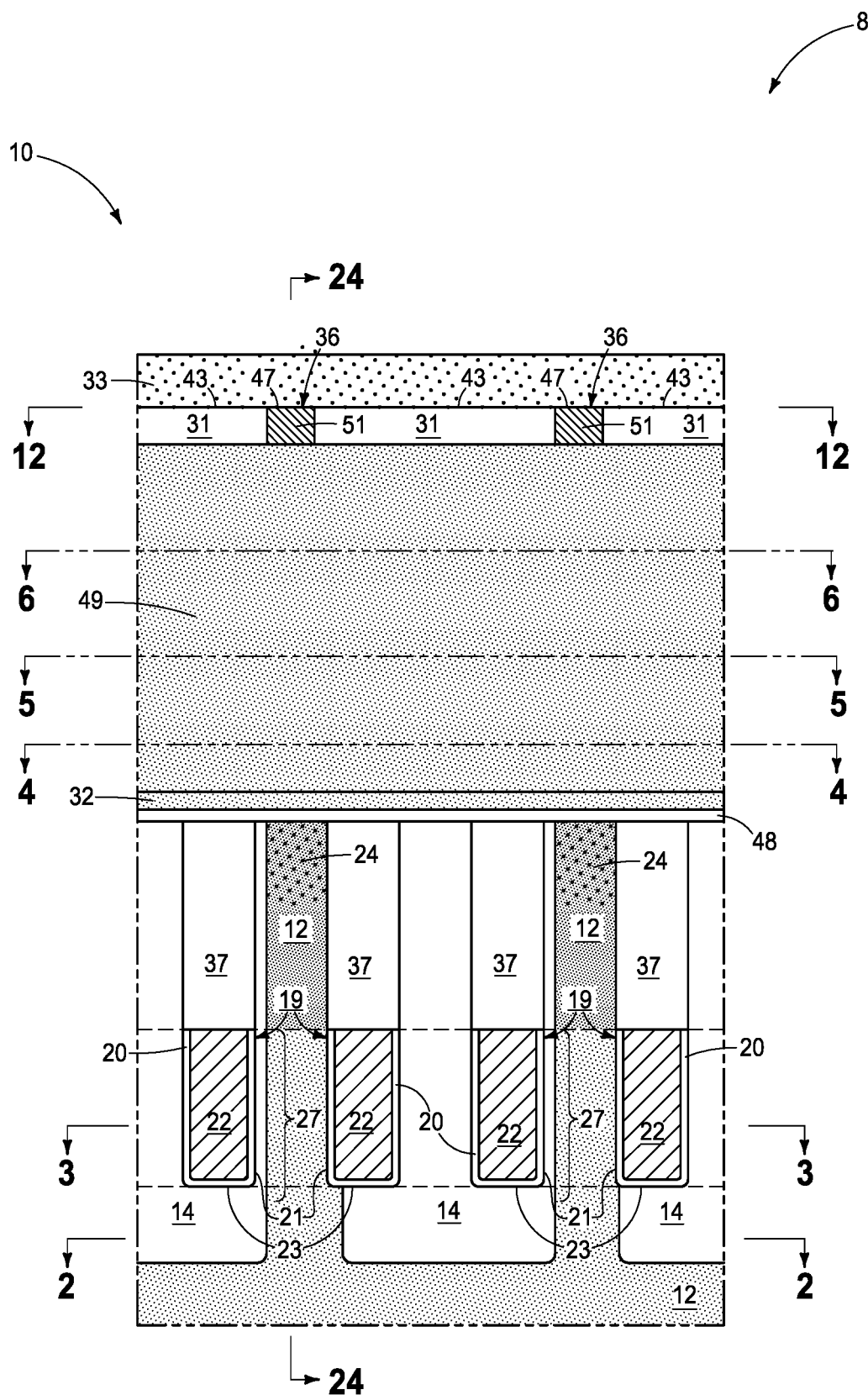
Figure 28:
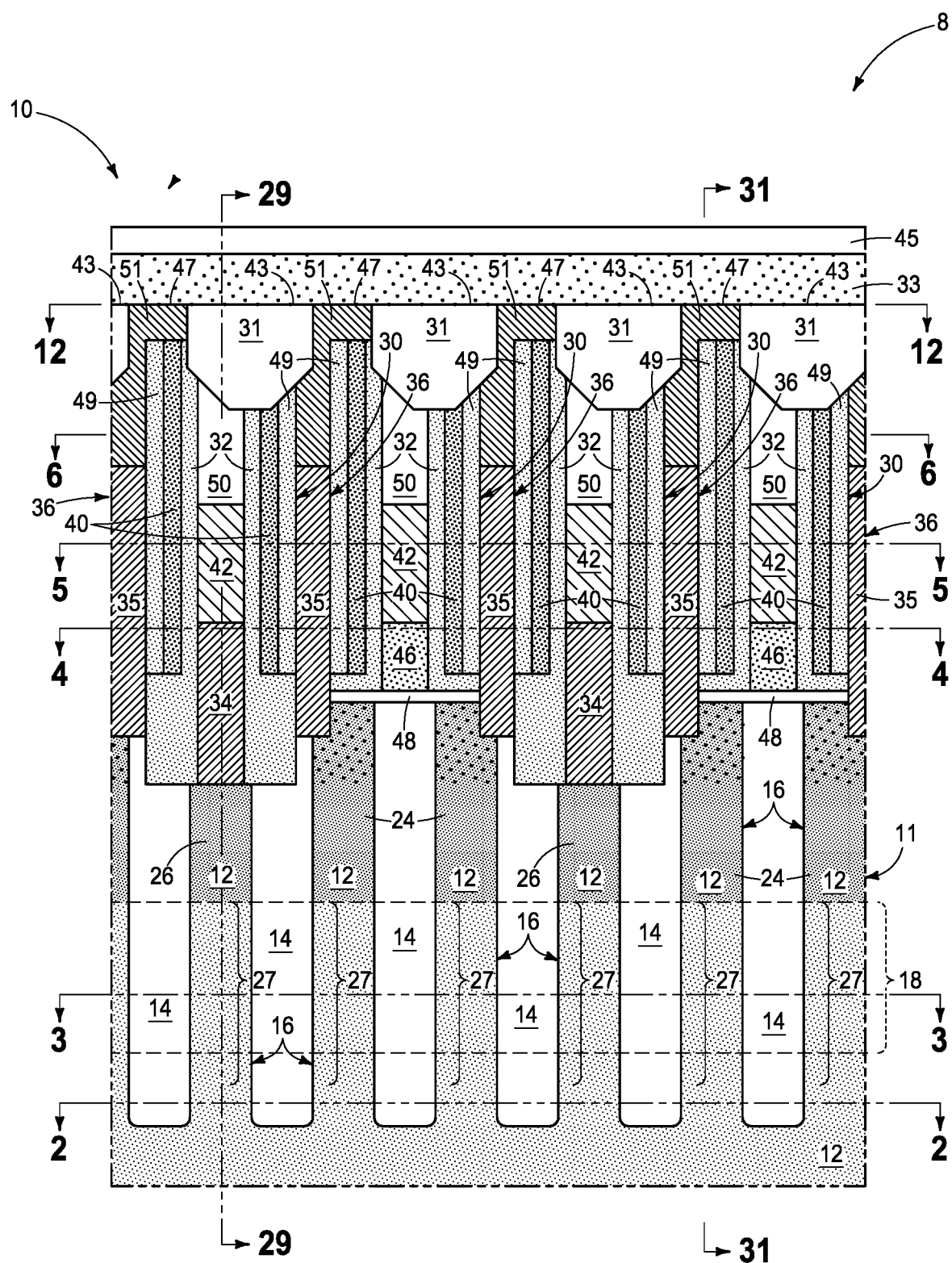
Figure 29:
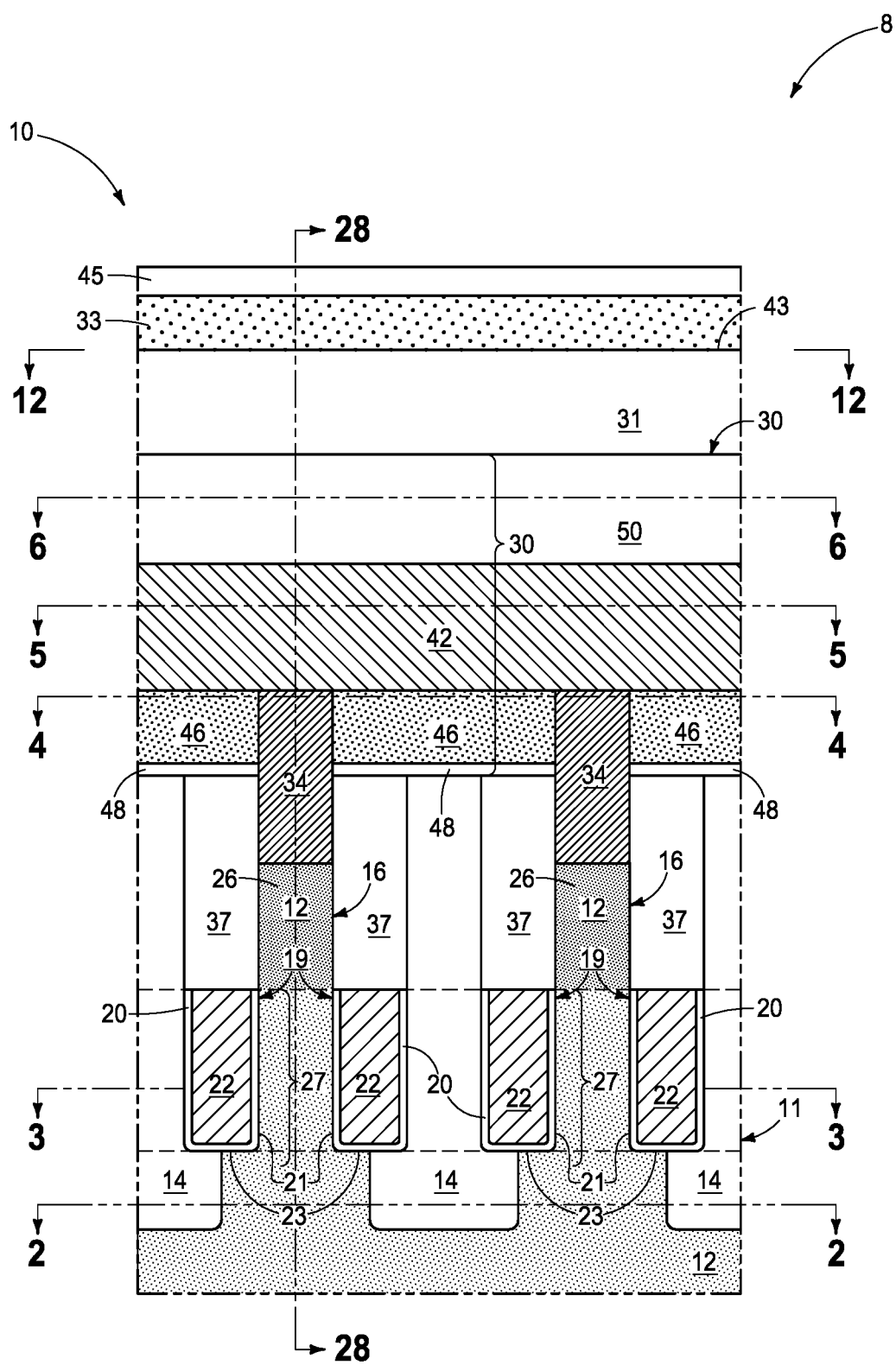
Figure 30:
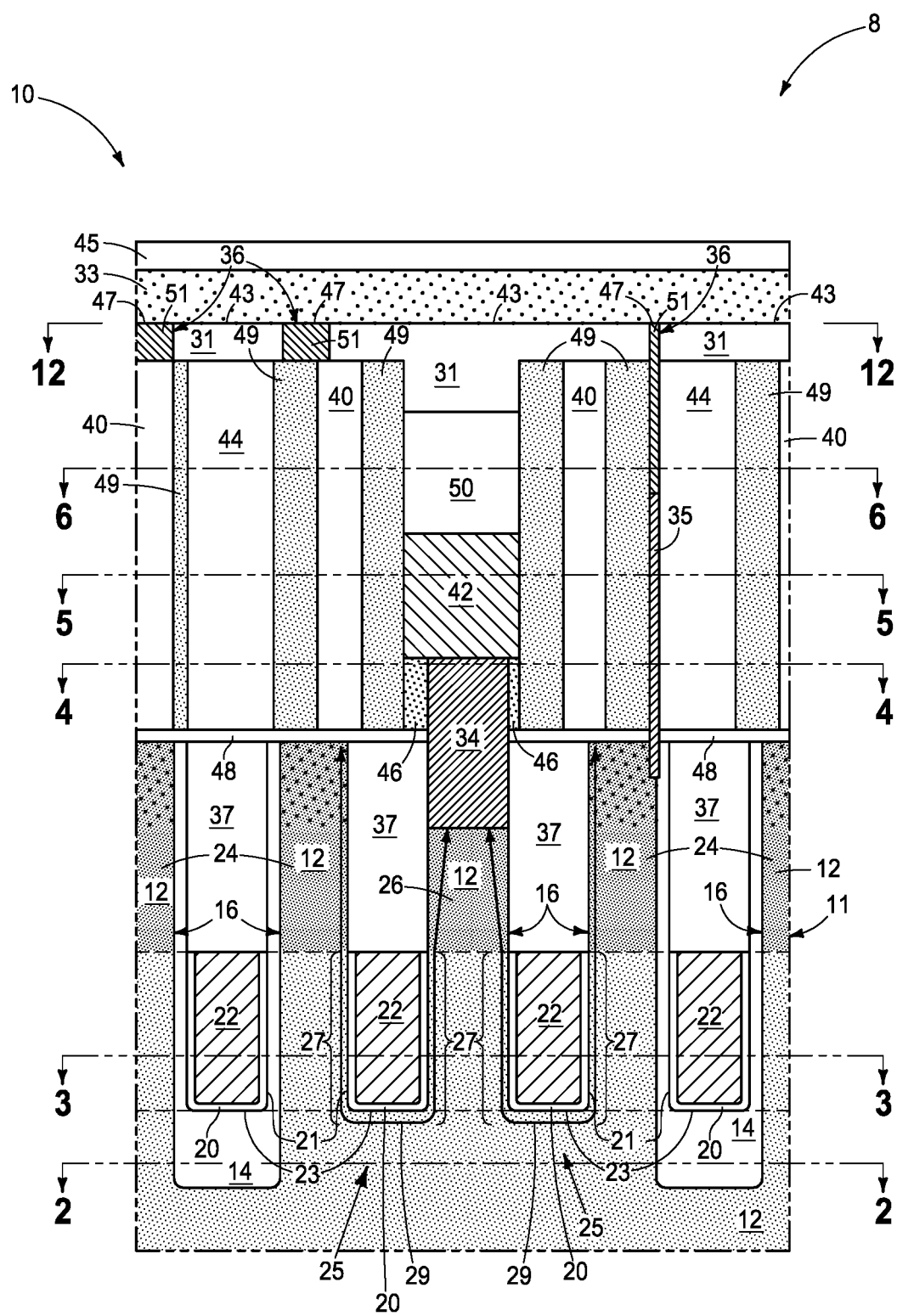
Figure 31:
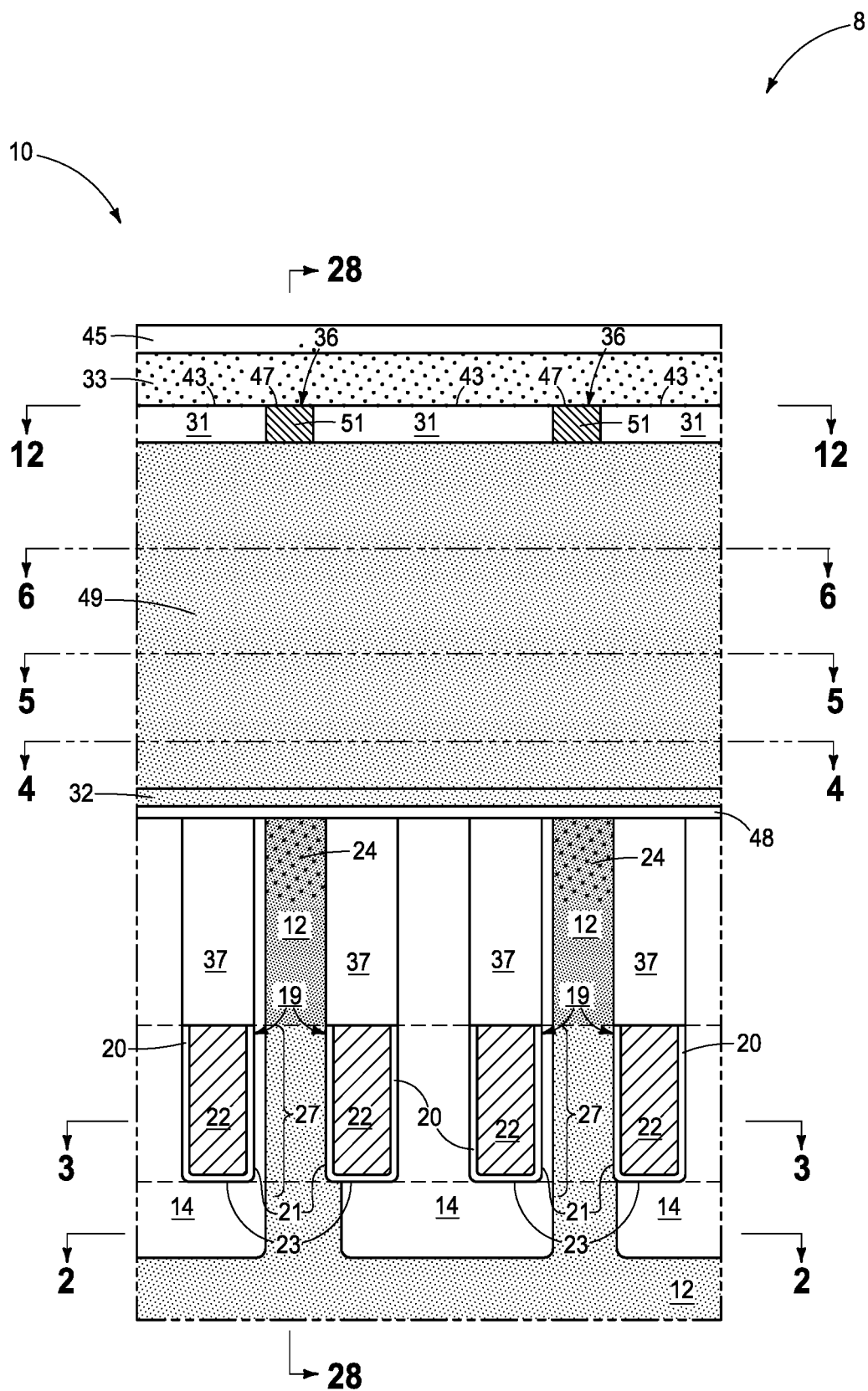

A pair of storage elements (e.g., charge-storage devices such as capacitors 85 shown as dashed lines in FIGS. 1, 9, and 10, but not yet fabricated) will individually directly electrically couple to one of the other source/drain regions 24 in the individual pairs of devices 25 (e.g., through conductive vias 36 as described below).

A first layer of insulator material 32 (e.g., silicon nitride), a second layer of insulator material 40 (e.g., silicon dioxide), and a third layer of insulator material 49 (e.g., silicon nitride) are alongside materials 34, 42, and 50 and comprise a part of digitline structures 30.

Insulative material 44 (e.g., silicon dioxide and/or silicon nitride) has been formed between digitline structures 30 and then patterned to form contact openings 41 there-through to individual non-shared source/drain regions 24. Conductive material 35 has subsequently been formed in openings 41, and in one embodiment has been etched back as shown, to form conductive vias 36 laterally between and spaced longitudinally along digitline structures 30 and that individually directly electrically couple to one of the other of source/drain regions 24 in the individual pairs of transistors. Example conductive vias 36 comprise uppermost conductive material 51 (e.g., elemental titanium under elemental tungsten) that is above digitline structures 30. Uppermost conductive material 51 may comprise what may conventionally be considered as a redistribution layer (RDL) or RDL material.

Referring to FIGS. 11-15, first insulating material 31 (e.g., oxide and/or nitride) has been formed laterally between uppermost conductive material 51 of immediately-adjacent conductive vias 36. In one embodiment, first insulating material 31 may be deposited to overfill the upwardly-open volume that is among uppermost conductive material 51 of conductive vias 36, followed by planarizing insulating material 31 back at least to top surfaces 47 of conductive vias 36. In one embodiment and as shown, first insulating material 31 and conductive vias 36 have top surfaces 43, 47, respectively, that are individually planar and are collectively co-planar.

Referring to FIGS. 16-19, second insulating material 33 has been formed directly above (e.g., directly against) first insulating material 31 and directly above (e.g., directly against) uppermost conductive material 51 of conductive vias 36 (e.g., by plasma-enhanced chemical vapor deposition using trimethyisilane and ammonia as precursors. An example thickness range for second insulating material 33 is 20 nanometers to 100 nanometers. Regardless, second insulating material 33 comprises silicon, carbon, nitrogen, and hydrogen (e.g., atomic form hydrogen). Example hydrogen is indicated with stippling, with greater density stippling indicating greater hydrogen content and lower density stippling indicating lower hydrogen content. The hydrogen may be homogenously distributed throughout second insulating material 33 or may be non-homogenously distributed throughout second insulating material 33. By way of example, hydrogen may be present at about 0.5 atomic percent to about 20 atomic percent and carbon may be present at about 0.5 atomic percent to about 20 atomic percent. In one embodiment, oxygen (e.g., atomic) is present, for example at about 0.1 atomic percent to about 5 atomic percent. In one embodiment, second insulating material 33 consists of or consists essentially of silicon, carbon, nitrogen, and hydrogen. In one embodiment, second insulating material 33 is silicon carbonitride that contains hydrogen. First insulating material 31 and second insulating material 33 may be of the same composition relative one another or may be of different compositions relative one another. In one embodiment, first insulating material 31 comprises silicon nitride (e.g., deposited by atomic layer deposition or plasma-enhanced chemical vapor deposition using a silane and ammonia as deposition precursors). In one embodiment, first insulating material 31 comprises an insulative oxide (e.g., silicon dioxide, hafnium oxide, aluminum oxide, etc.). In one embodiment, second insulating material 33 is directly against top surfaces 47 of conductive vias 36.

A third material 38 has been formed directly above (e.g., directly against) second insulating material 33, with the third material and the second insulating material comprising different compositions relative one another. In one embodiment, third material 38 is insulating material (e.g., an oxide and/or a nitride, a specific example being silicon nitride deposited by atomic layer deposition or plasma-enhanced chemical vapor deposition using a silane and ammonia as deposition precursors). Third material 38 may be of the same composition as first insulating material 31 or may be of different composition therefrom. An example thickness range for third material 38 is 7 nanometers to 100 nanometers.

Referring to FIGS. 20-23, and in one embodiment, second insulating material 33 (e.g., the entirety of construction 8 in FIGS. 16-19) has been annealed to cause hydrogen therein to move downwardly through conductive vias 36 and into other source/drain regions 24 of multiple transistors 25. Such annealing may also cause hydrogen to move into source/drain regions 26 (not shown). Third material 38 restricts upward movement of hydrogen from second insulating material 33 during such annealing. Example annealing conditions include from 100° C. to 800° C. for from 10 seconds to 24 hours. All hydrogen that was in second insulating material 33 (not shown) may move downwardly therefrom or alternately and more likely some hydrogen will remain therein (as shown).

Referring to FIGS. 24-27, and in one embodiment, after the annealing, third material 38 (not shown) has been removed from being directly above second insulating material 33 and thickness of second insulating material 33 has been reduced thereafter (e.g., to from 10 to 19 nanometers).

Referring to FIGS. 28-31, and in one embodiment, a fourth insulating material 45 (e.g., an oxide and/or a nitride, and in some embodiments referred to as insulative material 45; a specific example being silicon nitride deposited by atomic layer deposition or plasma-enhanced chemical vapor deposition using a silane and ammonia as deposition precursors) has been formed directly above (e.g., directly against) second insulating material 33 of reduced thickness.

An example thickness range for fourth insulating material 45 is 5 to 10 nanometers. First insulating material 31 and fourth insulating material 45 may be of the same composition relative one another or may be of different compositions relative one another. In one embodiment, the first, third, and fourth insulating materials are the same composition relative one another. In one embodiment, the fourth insulating material is silicon nitride (e.g., deposited by atomic layer deposition or plasma-enhanced chemical vapor deposition using a silane and ammonia as deposition precursors). In one embodiment, fourth insulating material 45 is thinner than second insulating material 33 in what will be a finished construction of the circuitry.

Figure 32:
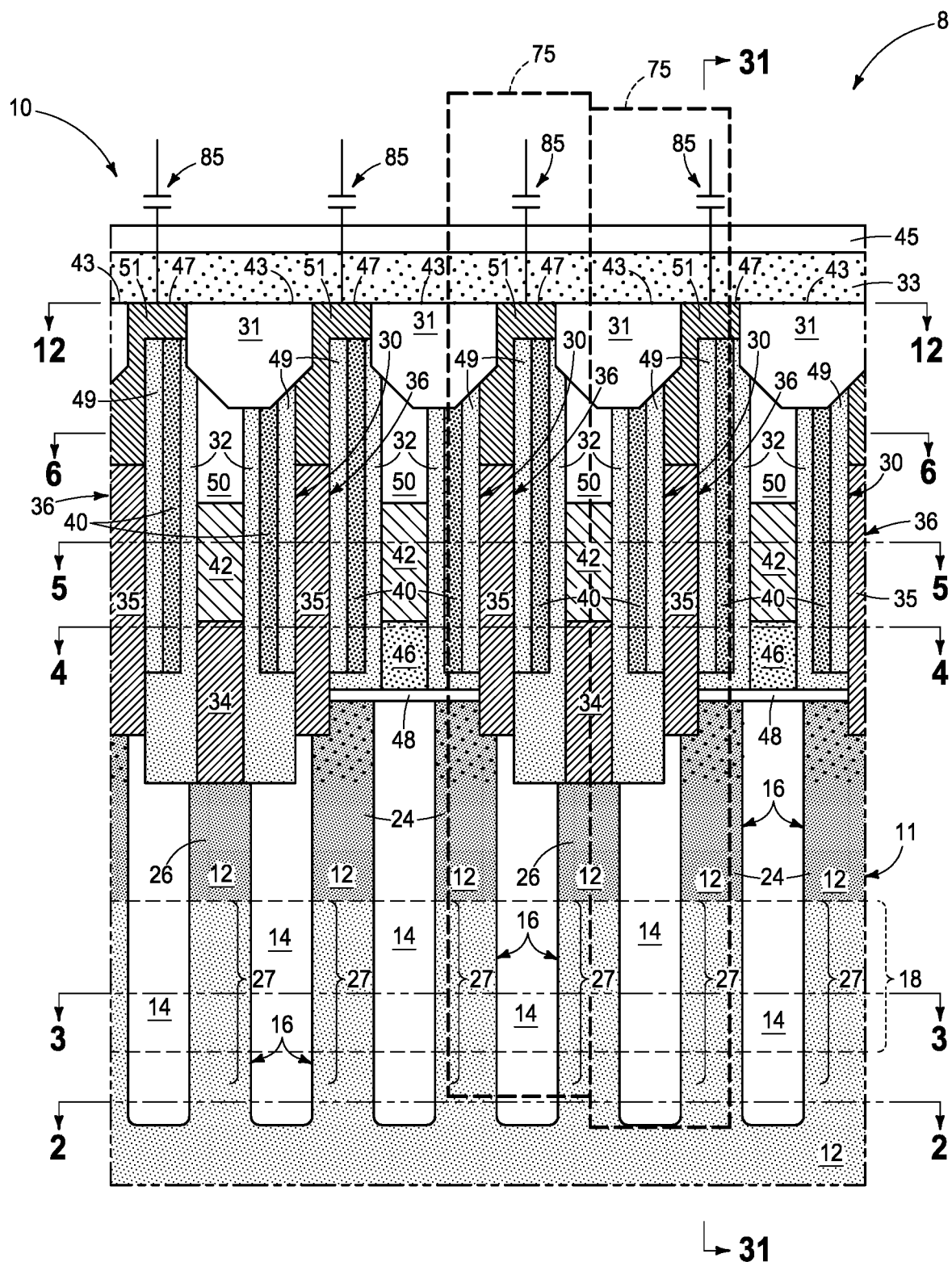
Figure 33:
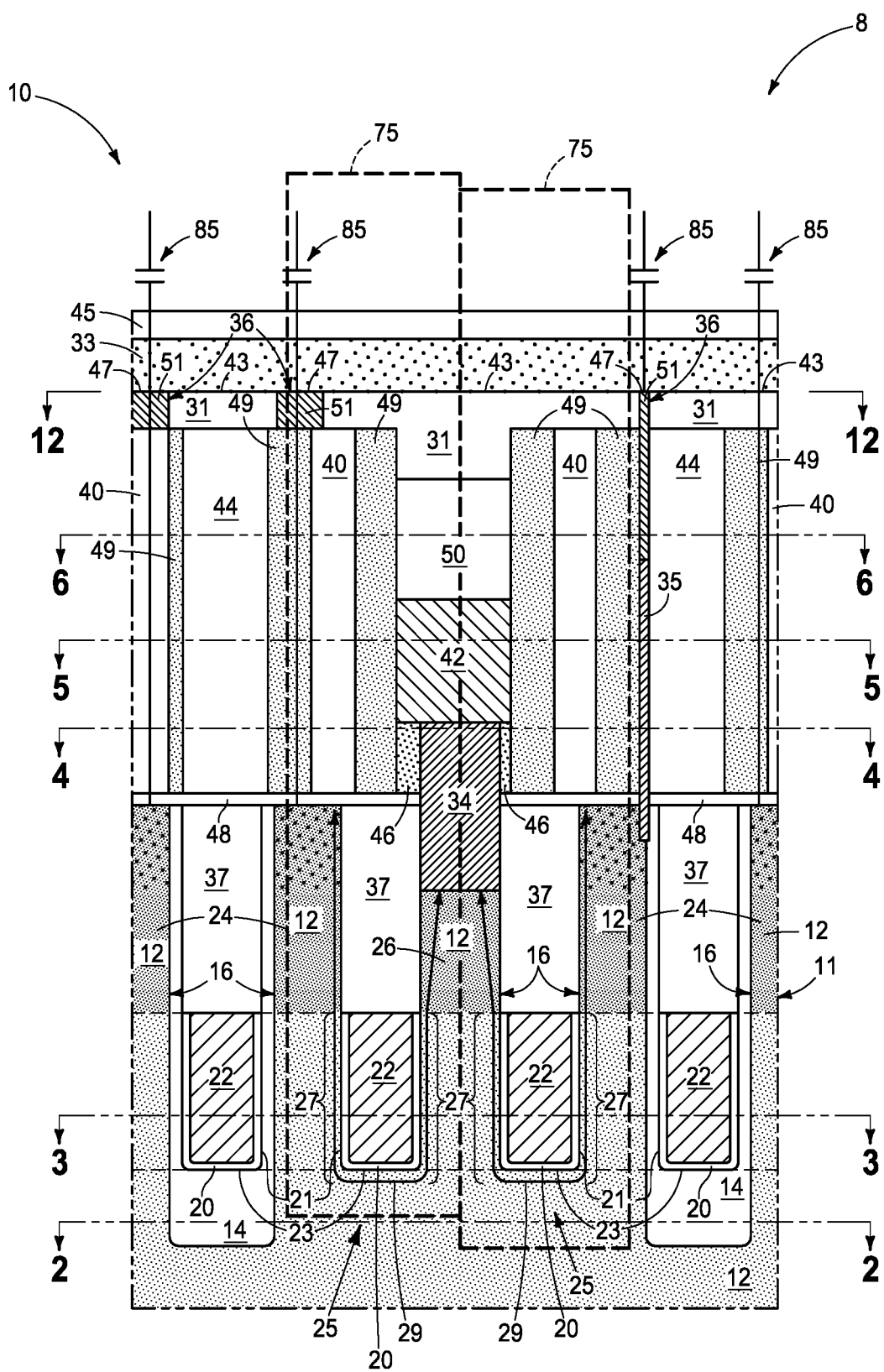
Figure 34:
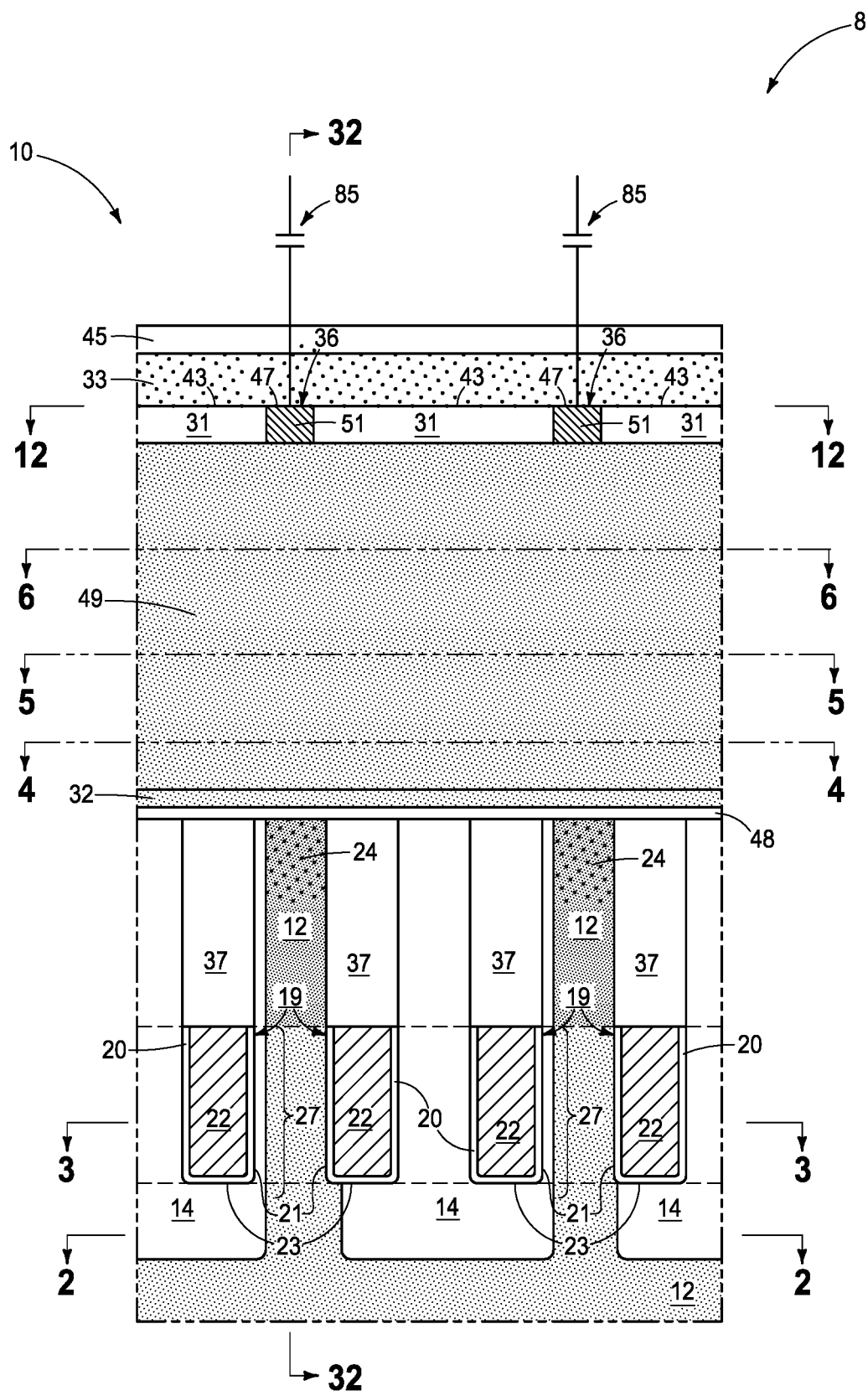

Referring to FIGS. 32-34, a plurality of storage elements (e.g., capacitors 85) have been formed that are individually directly electrically coupled to individual of conductive vias 36 through second insulating material 33 and through fourth insulating material 45 when present. As an example, a conductive via or part of a lower capacitor plate can extend through a vertical opening (not shown) in materials 45 and 33 to material 51 there-below.

Any other attribute(s) or aspect(s) as shown and/or described herein with respect to other embodiments may be used in the embodiments shown and described with reference to the above embodiments.

Embodiments of the invention encompass methods used in forming any existing or future-developed integrated circuitry, not just memory circuitry. Such a method comprises forming conductive line structures (e.g., 30) having conductive vias (e.g., 36) laterally between and spaced longitudinally along immediately-adjacent of the conductive line structures. First insulating material (e.g., 31) is laterally between immediately-adjacent of the conductive vias. Second insulating material (e.g., 33) is formed directly above the first insulating material and directly above the conductive vias. The second insulating material comprises silicon, carbon, nitrogen, and hydrogen. A third material (e.g., 38) is formed directly above the second insulating material. The third material and the second insulating material comprise different compositions relative one another. The third material is removed from being directly above the second insulating material and thickness of the second insulating material is reduced thereafter. A fourth insulating material (e.g., 45) is formed directly above the second insulating material of reduced thickness. A plurality of electronic components (e.g., 85) is formed above the fourth insulating material and that individually are directly electrically coupled to individual of the conductive vias through the fourth and second insulating materials. Any existing or future-developed electronic component may be formed. Any other attribute(s) or aspect(s) as shown and/or described herein with respect to other embodiments may be used.

Alternate embodiment constructions may result from method embodiments described above, or otherwise. Regardless, embodiments of the invention encompass existing or future-developed integrated circuitry independent of method of manufacture. Nevertheless, such circuitry may have any of the attributes as described herein in method embodiments. Likewise, the above-described method embodiments may incorporate, form, and/or have any of the attributes described with respect to device embodiments.

In one embodiment, integrated circuitry comprises conductive line structures (e.g., 30) having conductive vias (e.g., 36) laterally between and spaced longitudinally along immediately-adjacent of the conductive line structures. The conductive vias comprise uppermost conductive material (e.g., 51) that is above the conductive line structures. First insulating material (e.g., 31) is laterally between immediately-adjacent of the conductive vias. Second insulating material (e.g., 33) is directly above the first insulating material and directly above the uppermost conductive material of the conductive vias. The second insulating material comprises silicon, carbon, nitrogen, and hydrogen. Insulative material (e.g., 45) is directly above the second insulating material. The insulative material and the second insulating material comprise different compositions relative one another. A plurality of electronic components (e.g., 85) is above the insulative material and that individually are directly electrically coupled to individual of the conductive vias through the insulative material and second insulating material. Any other attribute(s) or aspect(s) as shown and/or described herein with respect to other embodiments may be used.

In one embodiment, DRAM circuitry (e.g., 10) comprises a substrate (e.g., 11) comprising transistors (e.g., 25) individually comprising a pair of source/drain regions (e.g., 24, 26), a channel region (e.g., 27) between the pair of source/drain regions, and a conductive gate (e.g., material 22) operatively proximate the channel region. Digitline structures (e.g., 30) are individually directly electrically coupled to one (e.g., 26) of the pair of source/drain regions of multiple of the transistors. Conductive vias (e.g., 36) are individually directly electrically coupled to one of the other (e.g., 24) source/drain regions of the multiple transistors. First insulating material (e.g., 31) is laterally between immediately-adjacent of the conductive vias. Second insulating material (e.g., 33) is directly above the first insulating material and directly above the uppermost conductive material of the conductive vias. The second insulating material comprises silicon, carbon, nitrogen, and hydrogen. Insulative material (e.g., 45) is directly above the second insulating material. The insulative material and the second insulating material comprise different compositions relative one another. A plurality of electronic components (e.g., 85) is above the insulative material and that individually are directly electrically coupled to individual of the conductive vias through the insulative material and the second insulating material. Uppermost portions of the other source/drain regions comprise hydrogen. Any other attribute(s) or aspect(s) as shown and/or described herein with respect to other embodiments may be used.

Provision of hydrogen at least in uppermost portions of source/drain regions 24 and/or 26 may improve an adverse phenomenon in DRAM known as row hammer and may reduce refresh time in DRAM.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45" from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming integrated circuitry comprises forming conductive line structures having conductive vias laterally between and spaced longitudinally along immediately-adjacent of the conductive line structures. First insulating material is formed laterally between immediately-adjacent of the conductive vias. Second insulating material is formed directly above the first insulating material and directly above the conductive vias. The second insulating material comprises silicon, carbon, nitrogen, and hydrogen. A third material is formed directly above the second insulating material. The third material and the second insulating material comprise different compositions relative one another. The third material is removed from being directly above the second insulating material and the thickness of the second insulating material is reduced thereafter. A fourth insulating material is formed directly above the second insulating material of reduced thickness. A plurality of electronic components is formed above the fourth insulating material and that individually are directly electrically coupled to individual of the conductive vias through the fourth and second insulating materials.

In some embodiments, a method used in forming memory circuitry comprises forming transistors that individually comprise a pair of source/drain regions, a channel region between the pair of source/drain regions, and a conductive gate operatively proximate the channel region. Digitline structures are formed that are individually directly electrically coupled to one of the source/drain regions of multiple of the transistors. Conductive vias are formed laterally between and spaced longitudinally along the digitline structures. Individual of the conductive vias are directly electrically coupled to one of the other source/drain regions of the multiple transistors. The conductive vias comprise uppermost conductive material of a redistribution layer. The uppermost conductive material is above the digitline structures. First insulating material is formed laterally between the uppermost conductive material of immediately-adjacent of the conductive vias. Second insulating material is formed directly above the first insulating material and directly above the uppermost conductive material of the conductive vias. The second insulating material comprises silicon, carbon, nitrogen, and hydrogen. A third material is formed directly above the second insulating material. The third material and the second insulating material comprise different compositions relative one another. The second insulating material is annealed to cause hydrogen therein to move downwardly through the conductive vias and into the other source/drain regions of the multiple transistors. The third material restricts upward movement of hydrogen from the second insulating material during said annealing. After the annealing, a plurality of storage elements is formed that are individually directly electrically coupled to individual of the conductive vias through the second insulating material.

In some embodiments, integrated circuitry comprises conductive line structures having conductive vias laterally between and spaced longitudinally along immediately-adjacent of the conductive line structures. The conductive vias comprise uppermost conductive material that is above the conductive line structures. First insulating material is laterally between immediately-adjacent of the conductive vias. Second insulating material is directly above the first insulating material and directly above the uppermost conductive material of the conductive vias. The second insulating material comprises silicon, carbon, nitrogen, and hydrogen. Insulative material is directly above the second insulating material and such comprise different compositions relative one another. A plurality of electronic components is above the insulative material that individually are directly electrically coupled to individual of the conductive vias through the insulative material and the second insulating material.

In some embodiments, DRAM circuitry comprising a substrate comprises transistors that individually comprise a pair of source/drain regions, a channel region between the pair of source/drain regions and a conductive gate operatively proximate the channel region. Digitline structures are individually directly electrically coupled to one of the pair of source/drain regions of multiple of the transistors. Conductive vias are individually directly electrically coupled to one of the other source/drain regions of the multiple transistors. First insulating material is laterally between immediately-adjacent of the conductive vias. Second insulating material is directly above the first insulating material and directly above the uppermost conductive material of the conductive vias. The second insulating material comprises silicon, carbon, nitrogen, and hydrogen. Insulative material is directly above the second insulating material and such comprise different compositions relative one another. A plurality of electronic components is above the insulative material that individually are directly electrically coupled to individual of the conductive vias through the insulative material and the second insulating material. Uppermost portions of the other source/drain regions comprise hydrogen.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming integrated circuitry, comprising:
   forming conductive line structures having conductive vias laterally between and spaced longitudinally along immediately-adjacent of the conductive line structures;
   forming first insulating material laterally between immediately-adjacent of the conductive vias;
   forming second insulating material directly above the first insulating material and directly above the conductive vias; the second insulating material comprising silicon, carbon, nitrogen, and hydrogen;
   forming a third material directly above the second insulating material, the third material and the second insulating material comprising different compositions relative one another;
   removing the third material from being directly above the second insulating material and reducing thickness of the second insulating material thereafter;
   forming a fourth insulating material directly above the second insulating material of reduced thickness; and
   forming a plurality of electronic components above the fourth insulating material that individually are directly electrically coupled to individual of the conductive vias through the fourth and second insulating materials.

2. The method of claim 1 comprising annealing the second insulating material before removing the third material to cause hydrogen in the second insulating material to move downwardly into the conductive vias, the third material restricting upward movement of hydrogen from the second insulating material during said annealing.

3. The method of claim 2 wherein the annealing causes the hydrogen to move through the conductive vias to below the conductive vias.

4. The method of claim 1 wherein the second insulating material comprises oxygen.

5. The method of claim 1 wherein the first and second insulating materials are of different compositions relative one another.

6. The method of claim 5 wherein the first insulating material comprises silicon nitride.

7. The method of claim 5 wherein the first insulating material comprises an insulative oxide.

8. The method of claim 1 wherein the first and second insulating materials are of the same composition relative one another.

9. The method of claim 1 wherein the second insulating material consists of or consists essentially of silicon, carbon, nitrogen, and hydrogen.

10. The method of claim 1 wherein the second insulating material is silicon carbonitride containing hydrogen.

11. The method of claim 1 wherein the first and fourth insulating materials are the same composition relative one another.

12. The method of claim 1 wherein the first insulative material and the third material are the same composition relative one another.

13. The method of claim 1 wherein the third material is insulating material.

14. The method of claim 13 wherein the first, third, and fourth insulating materials are the same composition relative one another.

15. The method of claim 1 wherein the first and fourth insulating materials are different compositions relative one another.

16. The method of claim 1 wherein the fourth insulating material is silicon nitride.

17. The method of claim 1 wherein the first and fourth insulating materials are silicon nitride and the second insulating material is silicon carbonitride containing hydrogen.

18. The method of claim 1 wherein the fourth insulating material is thinner than the second insulating material in a finished construction.

19. The method of claim 1 wherein the second insulating material is directly against top surfaces of the conductive vias.

20. The method of claim 1 wherein the first insulating material and the conductive vias have top surfaces that are individually planar and are collectively co-planar.

21. A method used in forming memory circuitry, comprising:
   forming transistors individually comprising:
      a pair of source/drain regions;
      a channel region between the pair of source/drain regions; and
      a conductive gate operatively proximate the channel region;

forming digitline structures that are individually directly electrically coupled to one of the source/drain regions of multiple of the transistors;

forming conductive vias laterally between and spaced longitudinally along the digitline structures, individual of the conductive vias being directly electrically coupled to another of the source/drain regions of the multiple transistors, the conductive vias comprising uppermost conductive material of a redistribution layer, the uppermost conductive material being above the digitline structures;

forming first insulating material laterally between the uppermost conductive material of immediately-adjacent of the conductive vias;

forming second insulating material directly above the first insulating material and directly above the uppermost conductive material of the conductive vias; the second insulating material comprising silicon, carbon, nitrogen, and hydrogen;

forming a third material directly above the second insulating material, the third material and the second insulating material comprising different compositions relative one another;

annealing the second insulating material to cause hydrogen therein to move downwardly through the conductive vias and into the another of the source/drain regions of the multiple transistors, the third material restricting upward movement of hydrogen from the second insulating material during said annealing; and after the annealing, forming a plurality of storage elements that are individually directly electrically coupled to individual of the conductive vias through the second insulating material.

22. The method of claim 21 comprising:

after the annealing, removing the third material from being directly above the second insulating material and reducing thickness of the second insulating material thereafter;

forming a fourth insulating material directly above the second insulating material of reduced thickness; and forming the plurality of storage elements to be individually directly electrically coupled to the individual conductive vias through the fourth and second insulating materials.

* * * * *